(12) United States Patent
Wang et al.

(10) Patent No.: US 12,484,291 B2
(45) Date of Patent: Nov. 25, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chun Chieh Wang, Kaohsiung (TW); Yueh-Ching Pai, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 657 days.

(21) Appl. No.: 17/868,294

(22) Filed: Jul. 19, 2022

(65) Prior Publication Data

US 2022/0352035 A1 Nov. 3, 2022

Related U.S. Application Data

(62) Division of application No. 16/937,732, filed on Jul. 24, 2020, now Pat. No. 11,410,889.

(Continued)

(51) Int. Cl.
*H10D 84/03* (2025.01)
*H01L 21/28* (2025.01)
(Continued)

(52) U.S. Cl.
CPC ..... *H10D 84/038* (2025.01); *H01L 21/28088* (2013.01); *H10D 30/024* (2025.01);
(Continued)

(58) Field of Classification Search
CPC .... H10D 84/038; H10D 64/667; H10D 30/62; H10D 62/121; H10D 30/024;
(Continued)

(56) References Cited

U.S. PATENT DOCUMENTS 9,761,683 B2   9/2017   Chou et al.
10,381,272 B1  8/2019   Sung
(Continued)

FOREIGN PATENT DOCUMENTS

CN   102214785 A   10/2011
CN   106158967 A   11/2016
(Continued)

OTHER PUBLICATIONS

Notice of Allowance issued in corresponding Korean Application No. 10-2020-0146833, dated Nov. 14, 2022, with English translation.

(Continued)

*Primary Examiner* — Zandra V Smith
*Assistant Examiner* — Andre C Stevenson
(74) *Attorney, Agent, or Firm* — STUDEBAKER BRACKETT PLLC

(57) ABSTRACT

In a method of manufacturing a semiconductor device, semiconductor layers, which are vertically arranged with a space between adjacent semiconductor layers, are provided over a substrate, an interfacial layer is formed around each of the semiconductor layers, a dielectric layer is formed on the interfacial layer around each of the semiconductor layers, a first conductive layer is formed on the dielectric layer, the first conductive layer is removed so that the dielectric layer is exposed, a second conductive layer is formed on the exposed dielectric layer so that the space between adjacent semiconductor layers is not fully filled by the second conductive layer, a third conductive layer is formed on the second conductive layer so that the space between adjacent semiconductor layers is filled by the third conductive layer, and the semiconductor layers are semiconductor wires or sheets.

20 Claims, 19 Drawing Sheets

Related U.S. Application Data

(60) Provisional application No. 62/955,804, filed on Dec. 31, 2019.

(51) Int. Cl.
   *H10D 30/01*    (2025.01)
   *H10D 30/62*    (2025.01)
   *H10D 30/67*    (2025.01)
   *H10D 62/10*    (2025.01)
   *H10D 64/66*    (2025.01)
   *H10D 84/01*    (2025.01)

(52) U.S. Cl.
   CPC ......... *H10D 30/0243* (2025.01); *H10D 30/62* (2025.01); *H10D 30/6219* (2025.01); *H10D 30/6735* (2025.01); *H10D 62/121* (2025.01); *H10D 64/667* (2025.01); *H10D 84/0177* (2025.01); *H10D 84/0193* (2025.01); *H01L 2221/1094* (2013.01)

(58) Field of Classification Search
   CPC ........... H10D 30/6735; H10D 30/6219; H10D 84/0177; H10D 84/0193; H10D 30/0243; H01L 21/28088; H01L 2221/1094
   See application file for complete search history.

(56) References Cited

U.S. PATENT DOCUMENTS

| | | | |
|---|---|---|---|
| 10,490,559 | B1 | 11/2019 | Ando et al. |
| 10,510,620 | B1 | 12/2019 | Chanemougame et al. |
| 10,763,177 | B1 | 9/2020 | Zhang et al. |
| 11,133,309 | B2 | 9/2021 | Zhang et al. |
| 11,177,387 | B2 | 11/2021 | Chen et al. |
| 11,195,763 | B2 | 12/2021 | Chiang et al. |
| 11,239,084 | B2 | 2/2022 | Colinge et al. |
| 11,410,889 | B2 * | 8/2022 | Wang .................. H10D 30/024 |
| 2016/0254261 | A1 | 9/2016 | Machkaoutsan et al. |
| 2017/0221889 | A1 | 8/2017 | Dasgupta et al. |
| 2018/0226484 | A1 | 8/2018 | Bao et al. |
| 2018/0315667 | A1 | 11/2018 | Kwon et al. |
| 2019/0081152 | A1 | 3/2019 | Suh et al. |
| 2019/0221433 | A1 | 7/2019 | Raisanen et al. |
| 2019/0237336 | A1 | 8/2019 | Wang et al. |
| 2019/0304848 | A1 | 10/2019 | Cheng et al. |
| 2019/0312120 | A1 | 10/2019 | Zhang et al. |
| 2019/0348530 | A1 | 11/2019 | Ando et al. |
| 2019/0355851 | A1 | 11/2019 | Seshadri et al. |
| 2019/0371903 | A1 | 12/2019 | Bao et al. |
| 2019/0378906 | A1 | 12/2019 | Loubet et al. |
| 2020/0006356 | A1 | 1/2020 | Ando et al. |
| 2020/0083326 | A1 | 3/2020 | Ok et al. |
| 2020/0312844 | A1 | 10/2020 | Jeon et al. |
| 2020/0373300 | A1 | 11/2020 | Zhang et al. |
| 2021/0013111 | A1 | 1/2021 | Smith et al. |
| 2021/0066490 | A1 * | 3/2021 | Yang .................. H10D 64/01 |

FOREIGN PATENT DOCUMENTS

| | | |
|---|---|---|
| CN | 107017205 A | 8/2017 |
| CN | 107068755 A | 8/2017 |
| CN | 109427905 A | 3/2019 |
| KR | 1020170041605 A | 4/2017 |
| KR | 10-2019-0028061 A | 3/2019 |
| KR | 1020190031855 A | 3/2019 |

OTHER PUBLICATIONS

Non-Final Office Action issued in U.S. Appl. No. 16/937,732, dated Nov. 26, 2021.

Notice of Allowance issued in U.S. Appl. No. 16/937,732, dated Mar. 22, 2022.

* cited by examiner

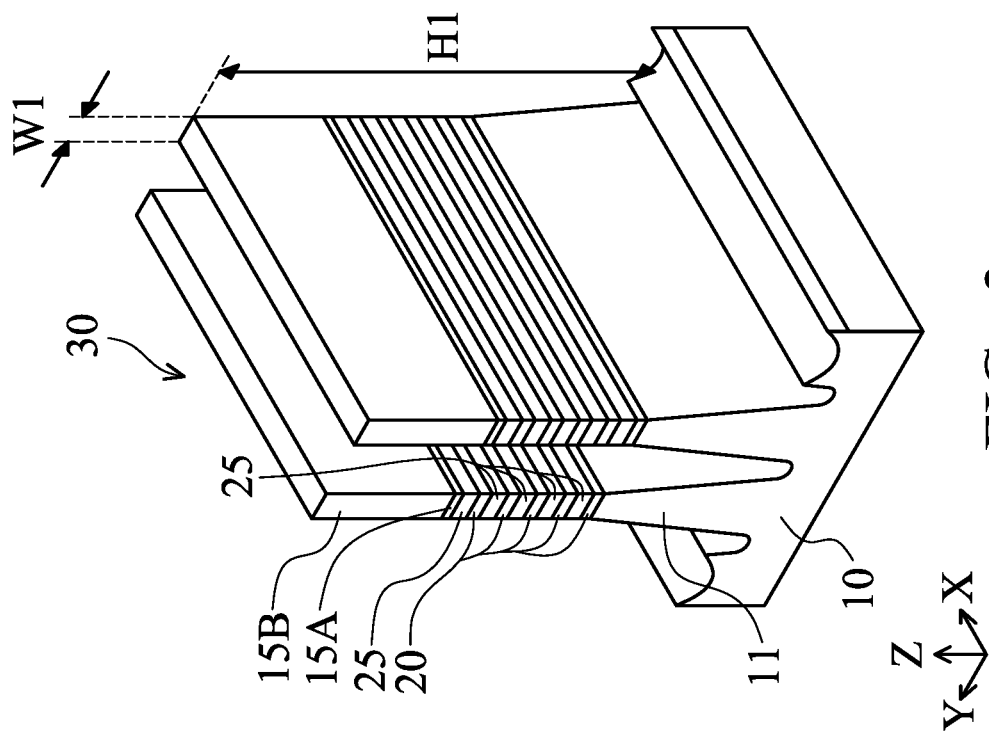
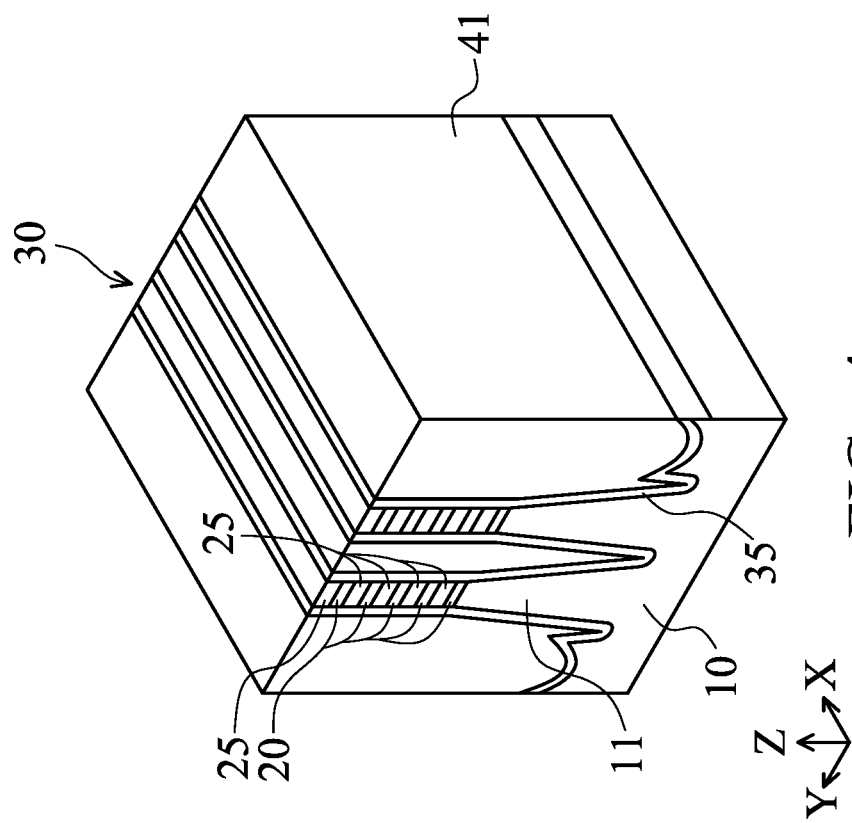
FIG. 3
FIG. 4

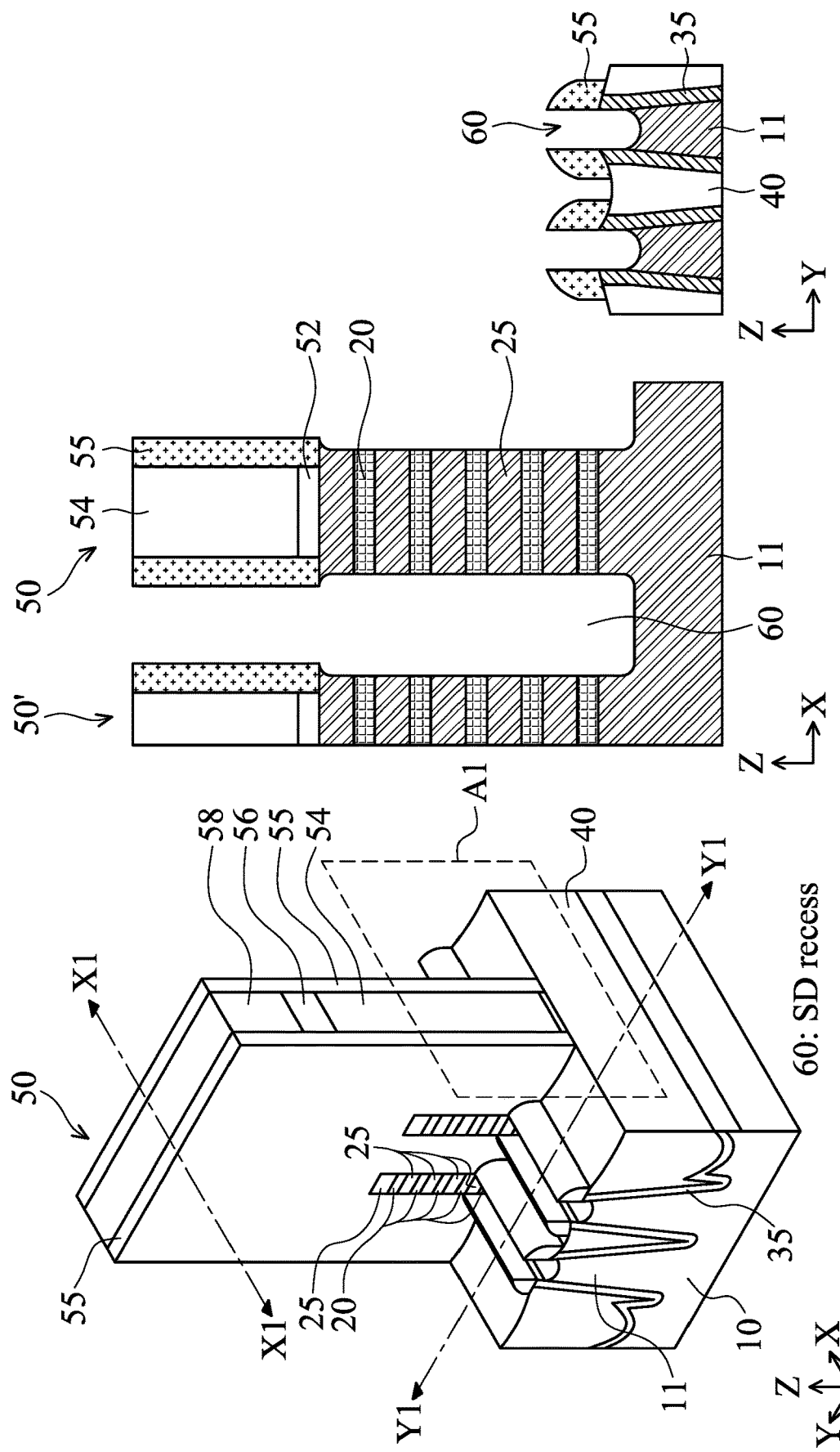

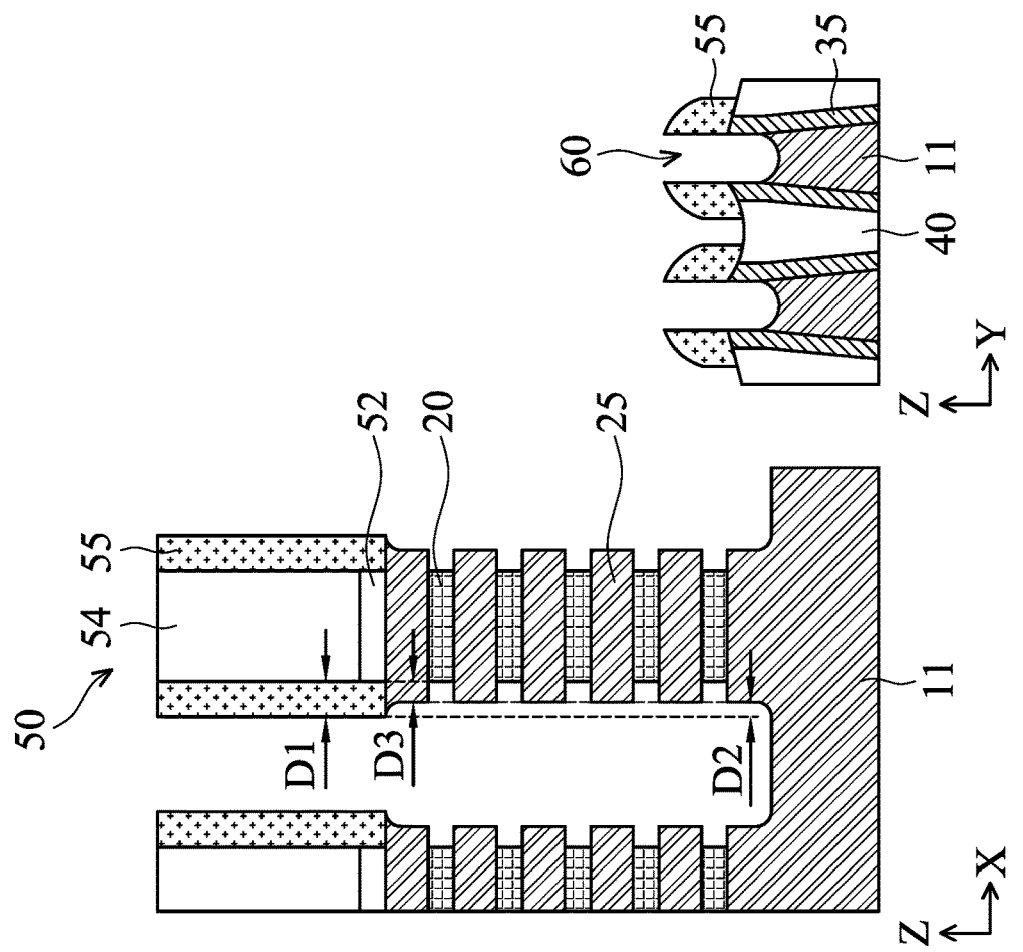
FIG. 10B
FIG. 10C
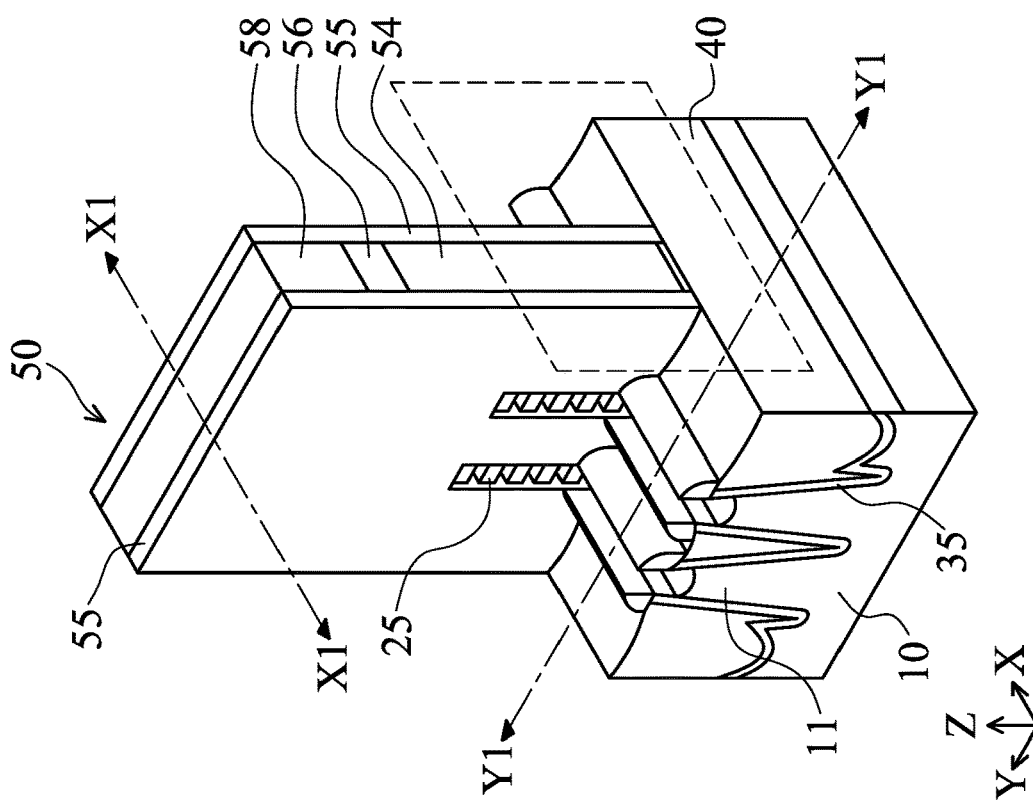
FIG. 10A

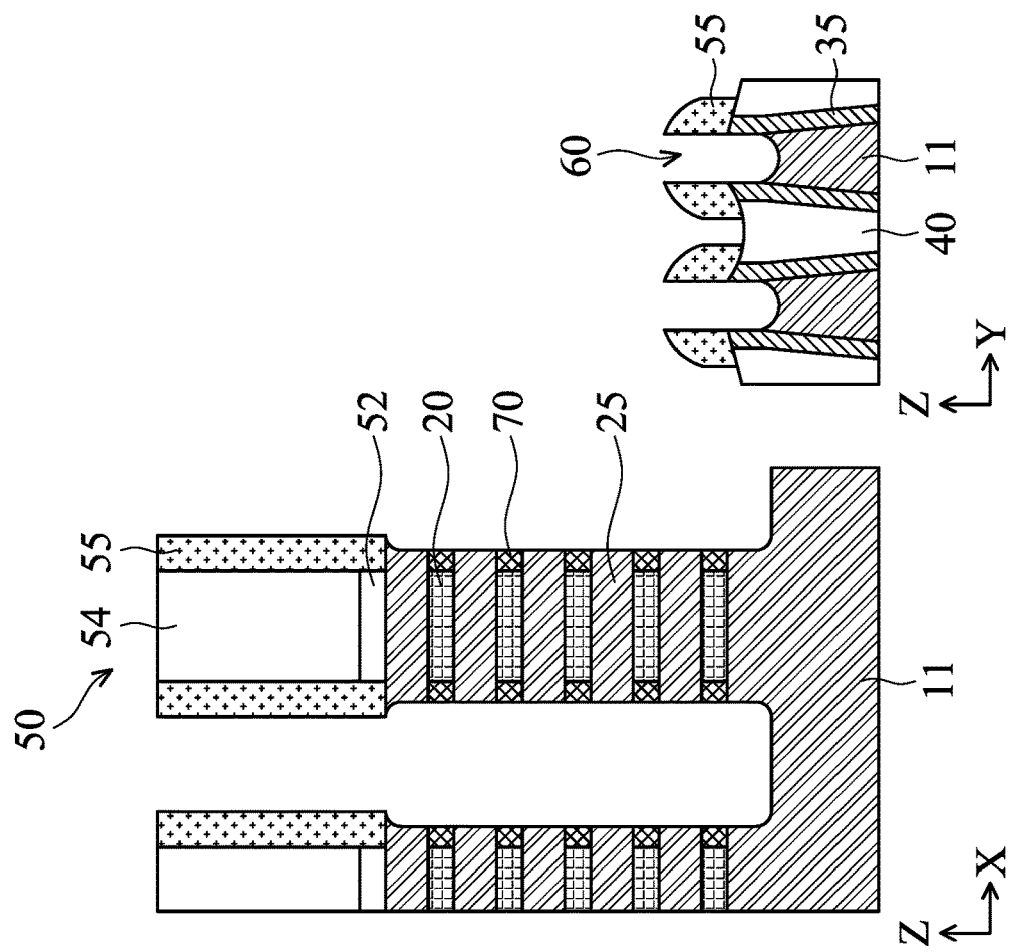
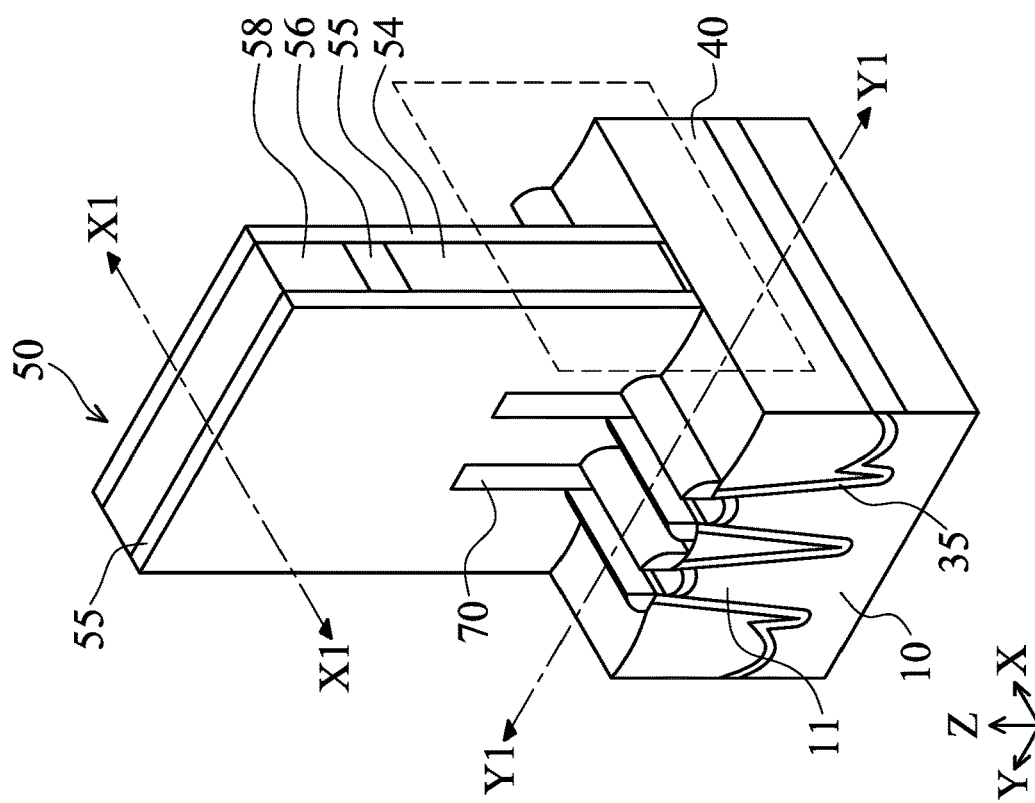
FIG. 11A  FIG. 11B  FIG. 11C

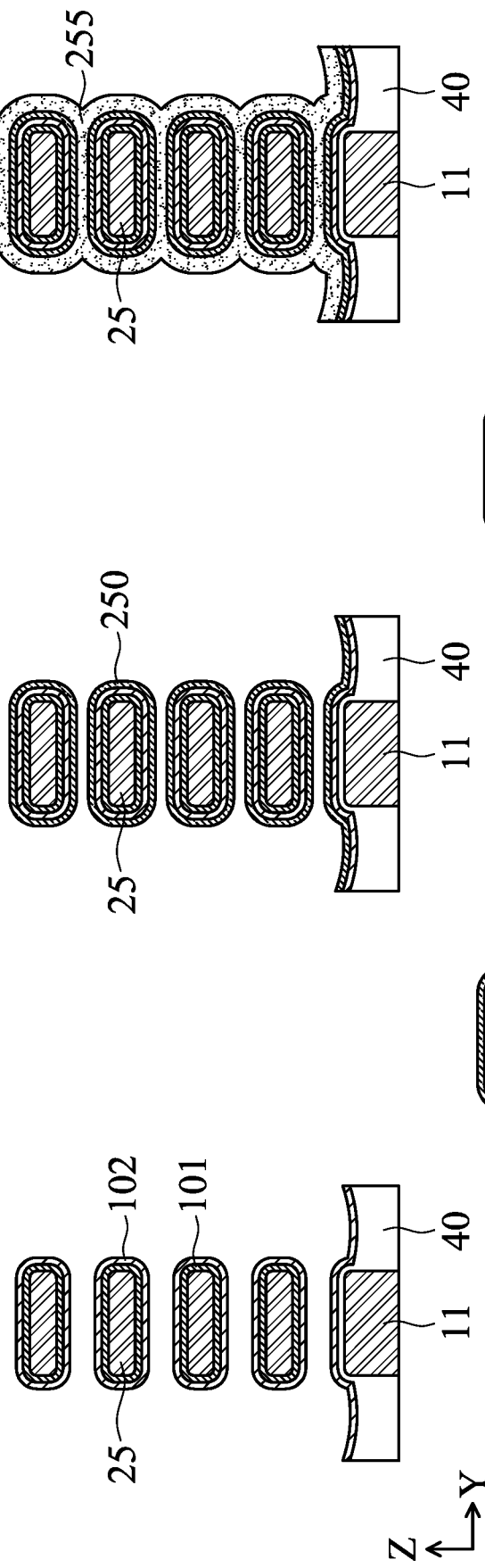
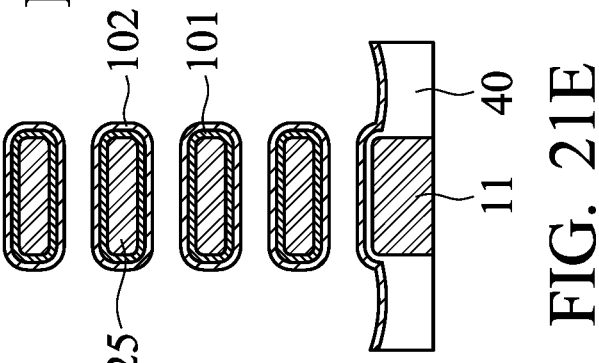
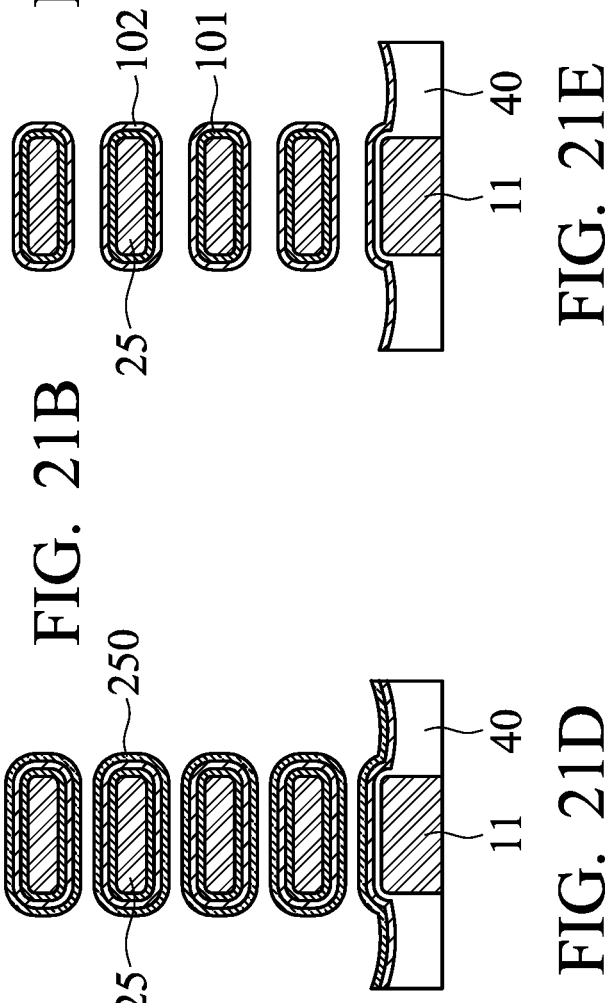
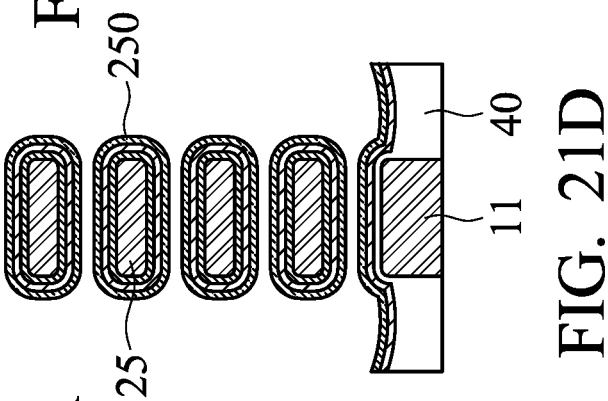
FIG. 21A
FIG. 21B
FIG. 21C
FIG. 21D
FIG. 21E

SEMICONDUCTOR DEVICE AND MANUFACTURING METHOD THEREOF

RELATED APPLICATIONS

This application is divisional of U.S. patent application Ser. No. 16/937,732 filed Jul. 24, 2020, now U.S. Pat. No. 11,410,889, which claims priority to U.S. Provisional Patent Application No. 62/955,804 filed Dec. 31, 2019, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. The fourth side (e.g., the bottom part) of the channel, however, is far away from the gate electrode and thus is not under close gate control. In contrast, in a GAA FET, all side surfaces of the channel region are surrounded by the gate electrode, which allows for fuller depletion in the channel region and results in less short-channel effects due to a steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows one of the various stages of a sequential manufacturing process of a GAA FET device according to embodiments of the present disclosure.

FIG. 4 shows one of the various stages of a sequential manufacturing process of a GAA FET device according to embodiments of the present disclosure.

FIGS. 9A, 9B and 9C show one of the various stages of a sequential manufacturing process of a GAA FET device according to embodiments of the present disclosure.

FIGS. 10A, 10B and 10C show one of the various stages of a sequential manufacturing process of a GAA FET device according to embodiments of the present disclosure.

FIGS. 11A, 11B and 11C show one of the various stages of a sequential manufacturing process of a GAA FET device according to embodiments of the present disclosure.

FIGS. 21A, 21B, 21C, 21D and 21E show various stages of a sequential manufacturing process of a GAA FET device according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

FIGS. 1-19 show exemplary sequential processes for manufacturing the nanostructure FET device, for example, GAA (Gate all around) FET device according to one embodiment of the present disclosure. It is understood that additional operations can be provided before, during, and after processes shown by FIGS. 1-19, and some of the operations described below can be replaced or eliminated, for additional embodiments of the method. The order of the operations/processes may be interchangeable.

Figure 1:
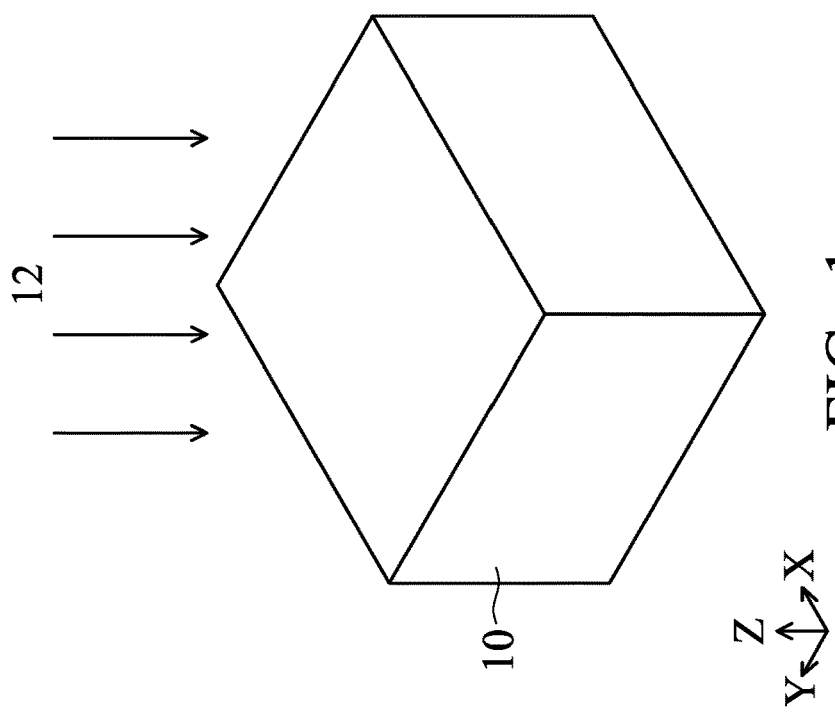
FIG. 1 shows one of the various stages of a sequential manufacturing process of a GAA FET device according to embodiments of the present disclosure.

As shown in FIG. 1, impurity ions (dopants) 12 are implanted into a silicon substrate 10 to form a well region. The ion implantation is performed to prevent a punch-through effect.

In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from about 30 atomic % germanium for the bottom-most buffer layer to about 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 2:
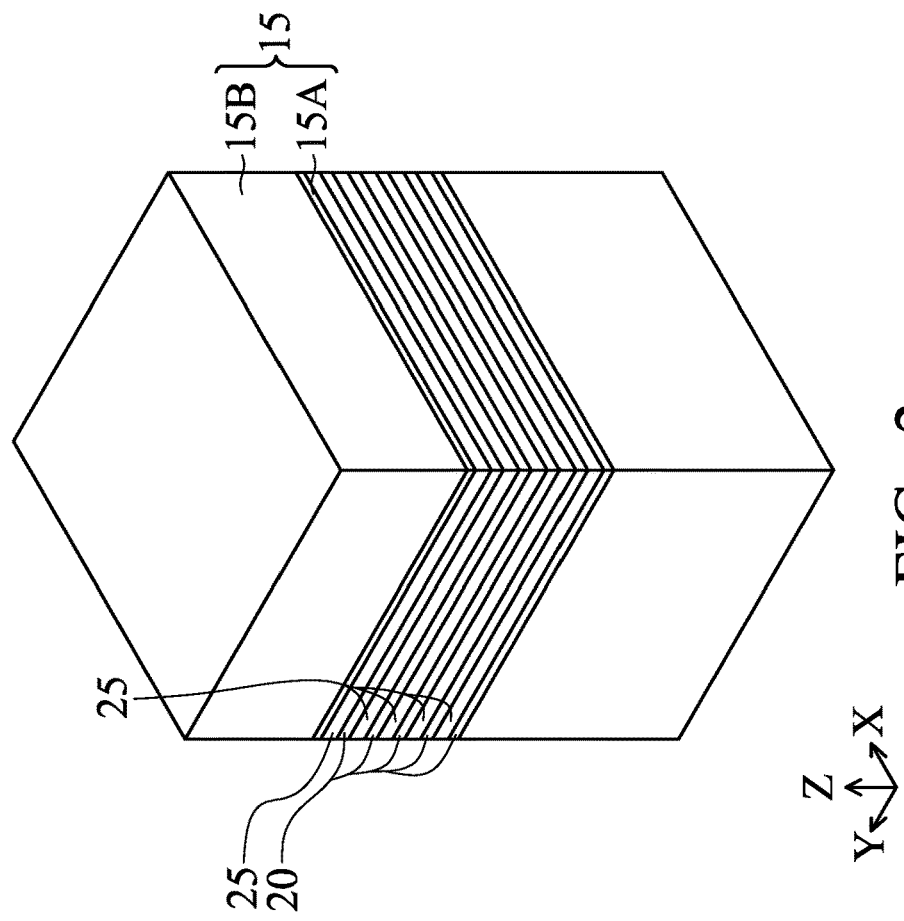
FIG. 2 shows one of the various stages of a sequential manufacturing process of a GAA FET device according to embodiments of the present disclosure.

In FIG. 2, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4.

In FIG. 2, five layers of the first semiconductor layer 20 and five layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Next, as shown in FIG. 3, the stacked layers of the first and second semiconductor layers 20, 25 are patterned by using the patterned mask layer, thereby the stacked layers are formed into fin structures 30 extending in the X direction. In FIG. 3, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

As shown in FIG. 3, the fin structures 30 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

In some embodiments, a first liner layer 35 is formed over the structure of FIG. 3 before forming the insulating material layer 41, as shown FIG. 4. The first liner layer 35 is made of SiN or a silicon nitride-based material (e.g., SiON, SiCN or SiOCN).

Figure 5:
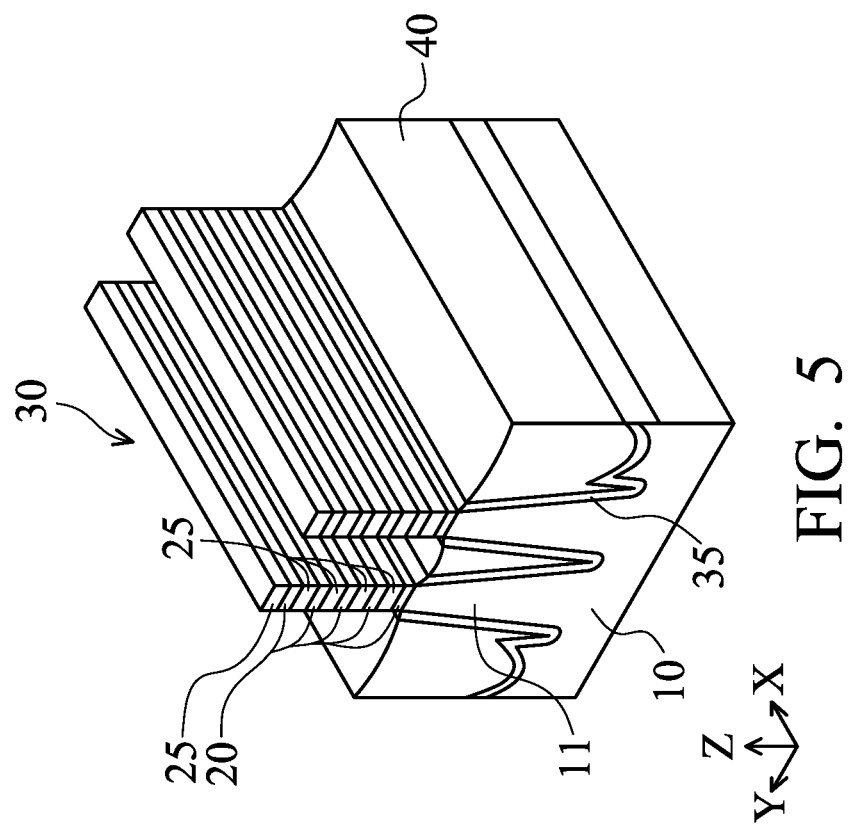
FIG. 5 shows one of the various stages of a sequential manufacturing process of a GAA FET device according to embodiments of the present disclosure.

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6:
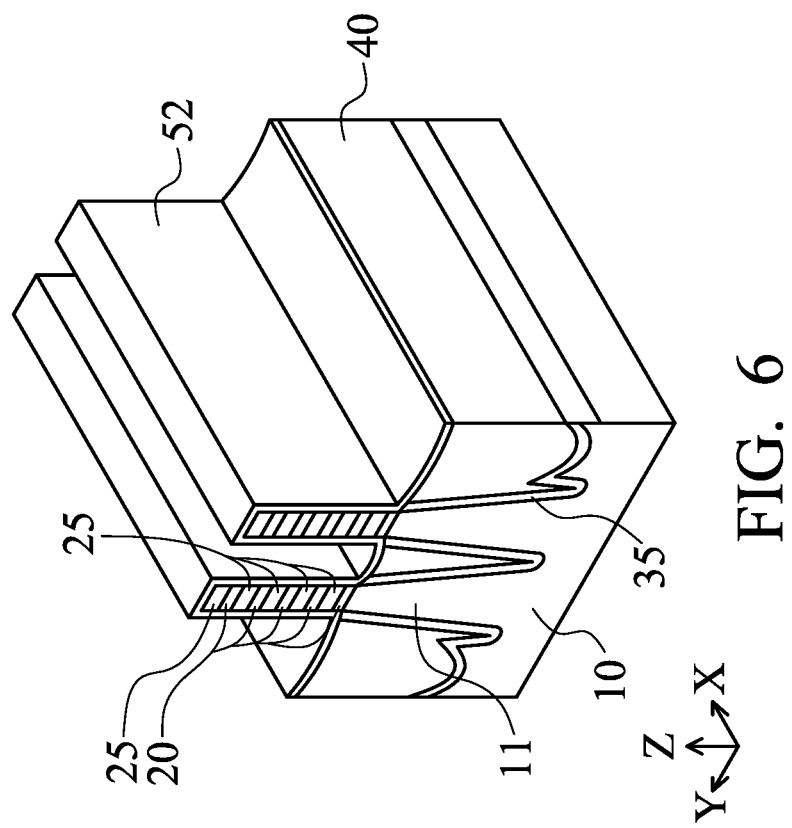
FIG. 6 shows one of the various stages of a sequential manufacturing process of a GAA FET device according to embodiments of the present disclosure.

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
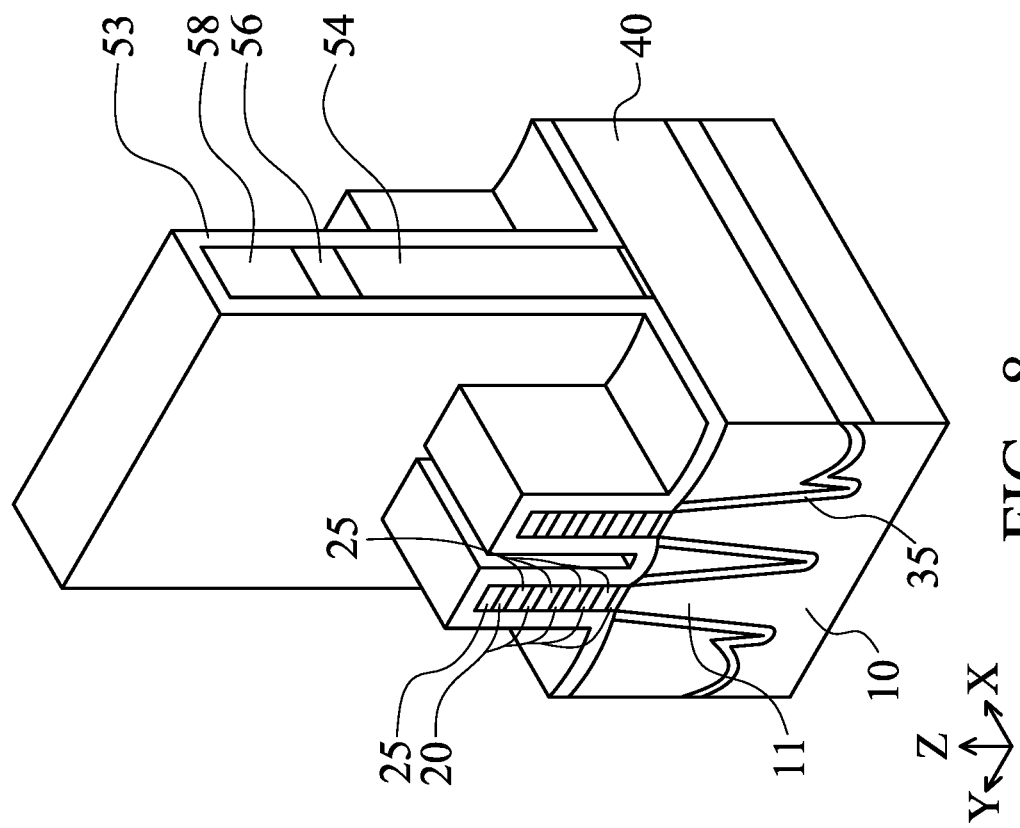
FIG. 7 shows one of the various stages of a sequential manufacturing process of a GAA FET device according to embodiments of the present disclosure.

FIG. 7 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures, as shown in FIG. 7. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 7. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
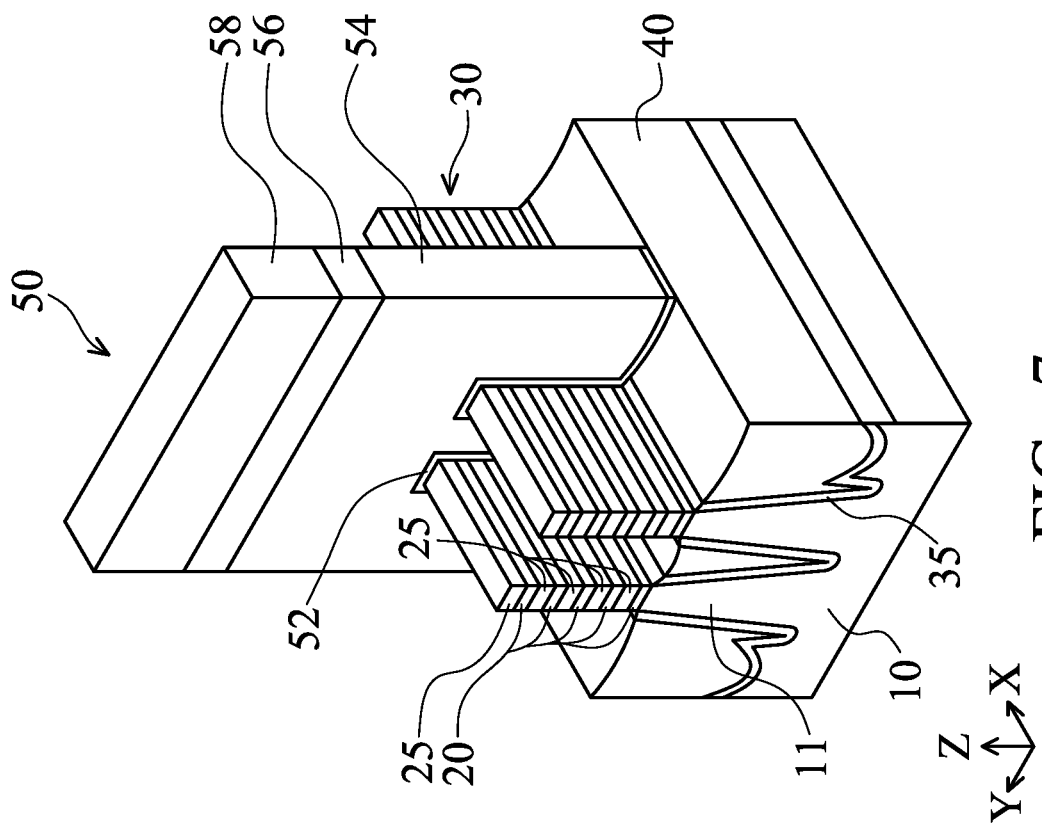
FIG. 8 shows one of the various stages of a sequential manufacturing process of a GAA FET device according to embodiments of the present disclosure.

After the sacrificial gate structure is formed, a blanket layer 53 of an insulating material for sidewall spacers 55 is conformally formed by using CVD or other suitable methods, as shown in FIG. 8. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Further, as shown in FIGS. 9A-9C, sidewall spacers 55 are formed on opposite sidewalls of the sacrificial gate structures, and subsequently, the fin structures of the S/D regions are recessed down below the upper surface of the isolation insulating layer 40. FIG. 9B is the cross sectional view corresponding to area A1 and line X1-X1 of FIG. 9A, and FIG. 9C is the cross sectional view corresponding to line Y1-Y1 of FIG. 9A. In FIG. 9B, the cross section of the bottom parts of one sacrificial gate structure 50 and an adjacent sacrificial gate structure 50' are illustrated.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching.

As shown in FIGS. 9A and 9C, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 9B. In some embodiments, the end portions of the stacked layer of the first and second semiconductor layers 20, 25 are slightly horizontally etched.

Subsequently, as shown in FIGS. 10A-10C, the first semiconductor layers 20 are horizontally recessed (etched) so that edges of the first semiconductor layers 20 are located substantially below a side face of the sacrificial gate electrode layer 54. As shown in FIG. 10B, end portions (edges) of the first semiconductor layers 20 under the sacrificial gate structure are substantially flush with the side faces of the sacrificial gate electrode layer 54. Here, "being substantially flush" means the difference in the relative position is less than about 1 nm.

During the recess etching of the first semiconductor layers 20 and/or the recess etching of the first and second semiconductor layers as described with FIGS. 9A-9C, end portions of the second semiconductor layers 25 are also horizontally etched, as shown in FIG. 10B. The recessed amount of the first semiconductor layers 20 is greater than the recessed amount of the second semiconductor layers 25.

The depth D1 of the recessing of the first semiconductor layers 20 from the plane including one sidewall spacer is in a range from about 5 nm to about 10 nm, the depth D2 of the recessing of the second semiconductor layers 25 from the plane including one sidewall spacer is in a range from about 1 nm to about 4 nm, in some embodiments. The difference D3 of the depth D1 and the depth D2 is in a range from about 1 nm to about 9 nm, in some embodiments.

In certain embodiments, the etching (horizontally recessing) the first and second semiconductor layers is not performed. In other embodiments, the amounts of etching of the first and second semiconductor layers are substantially the same (difference is less than about 0.5 nm). In some embodiments, the etched face has a curved shape.

After the first semiconductor layers 20 are horizontally recessed, a liner insulating layer is formed on the recessed surfaces of the first and second semiconductor layers 20, 25, and then anisotropic etching is performed to form inner spacers 70, as shown in FIGS. 11A-11C. In some embodiments, the inner spacers 70 are made of one or more layers of silicon oxide, silicon nitride, SiON, SiOC, SiOCN or any other suitable insulating material. The thickness of the inner spacers 70 on the recessed surface of the second semiconductor layers 25 is in a range from about 1 nm to about 4 nm, in some embodiments.

Figure 12:
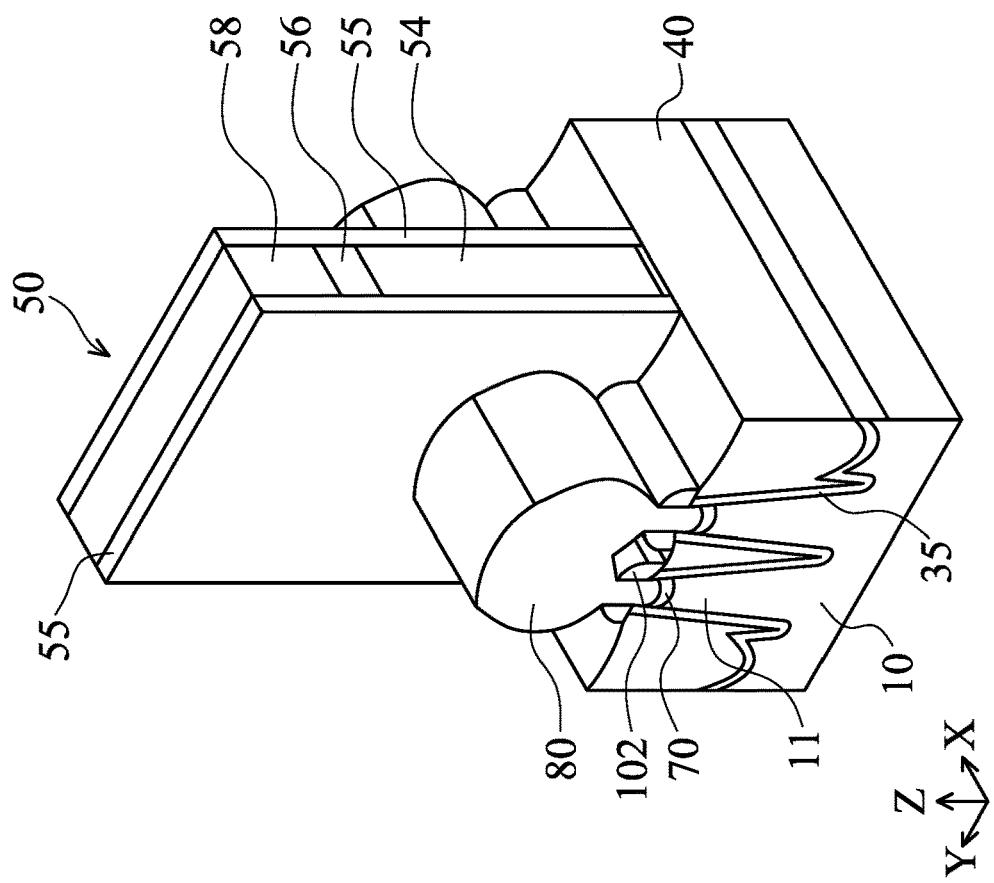
FIG. 12 shows one of the various stages of a sequential manufacturing process of a GAA FET device according to embodiments of the present disclosure.

Then, source/drain (S/D) epitaxial layers 80 are formed, as shown in FIG. 12. The S/D epitaxial layer 80 includes one or more layers of Si, SiP, SiC and SiCP for an n-channel FET or Si, SiGe, Ge for a p-channel FET. The S/D layers 80 are formed by an epitaxial growth method using CVD, ALD or molecular beam epitaxy (MBE). As shown in FIG. 10, the epitaxial layers merge above the isolation insulating layer and form a void 82 in some embodiments. In other embodiments, an epitaxial layer is individually formed on one S/D region without merging.

Figure 13:
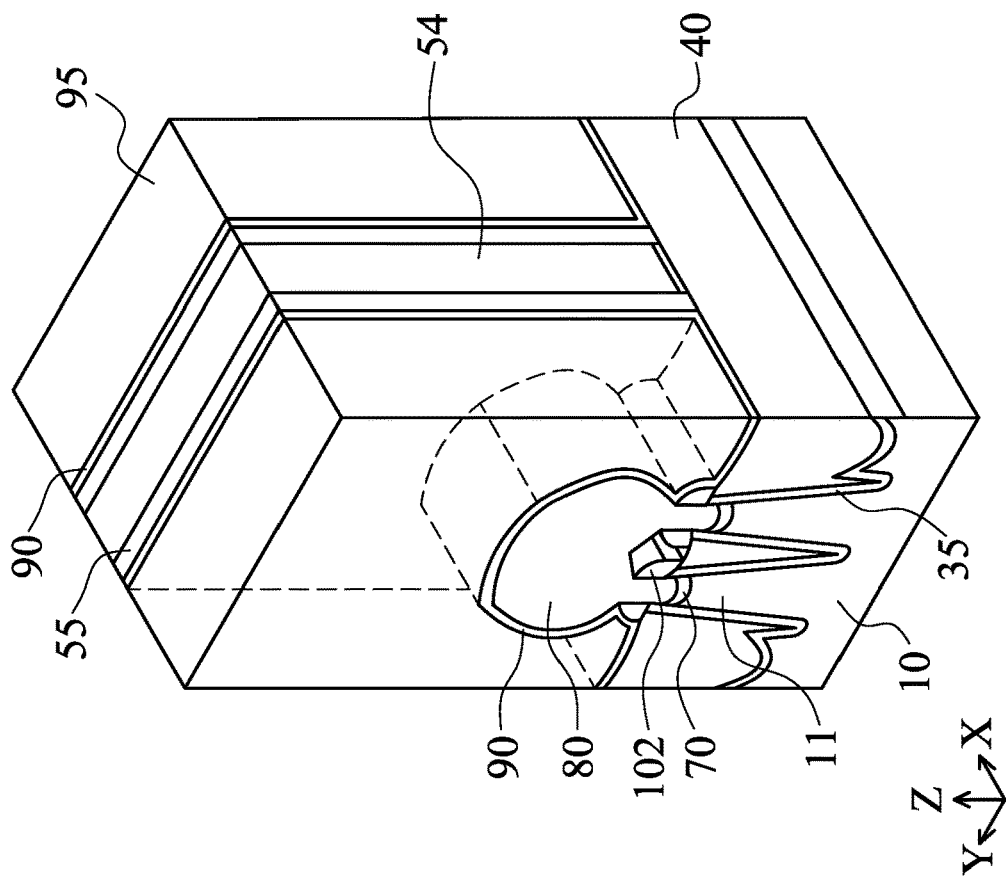
FIG. 13 shows one of the various stages of a sequential manufacturing process of a GAA FET device according to embodiments of the present disclosure.

Subsequently, a liner layer 90 is formed and then an interlayer dielectric (ILD) layer 95 is formed, as shown in FIG. 13. The liner layer 90 is made of a silicon nitride-based material, such as SiN, and functions as a contact etch stop layer in the subsequent etching operations. The materials for the ILD layer 95 include compounds comprising Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer 54 is exposed.

Figure 14:
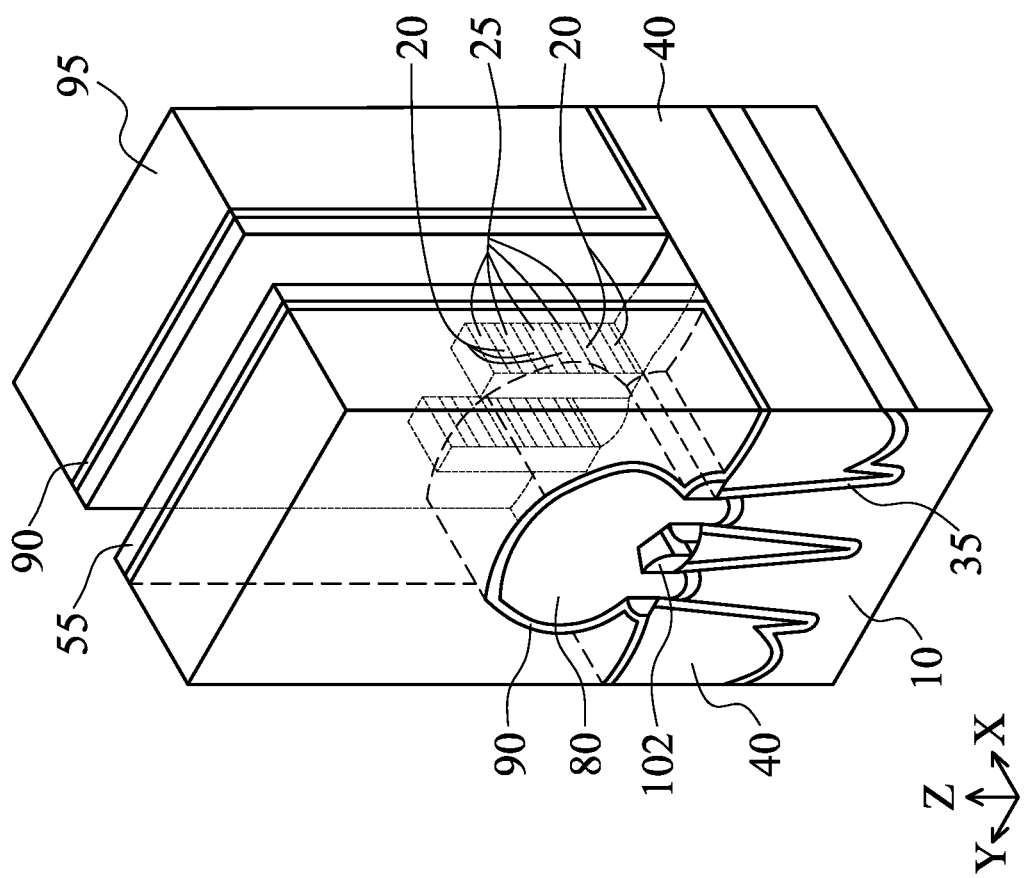
FIG. 14 shows one of the various stages of a sequential manufacturing process of a GAA FET device according to embodiments of the present disclosure.

Next, as shown in FIG. 14, the sacrificial gate electrode layer 54 and sacrificial gate dielectric layer 52 are removed, thereby exposing the fin structures. The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 15B:
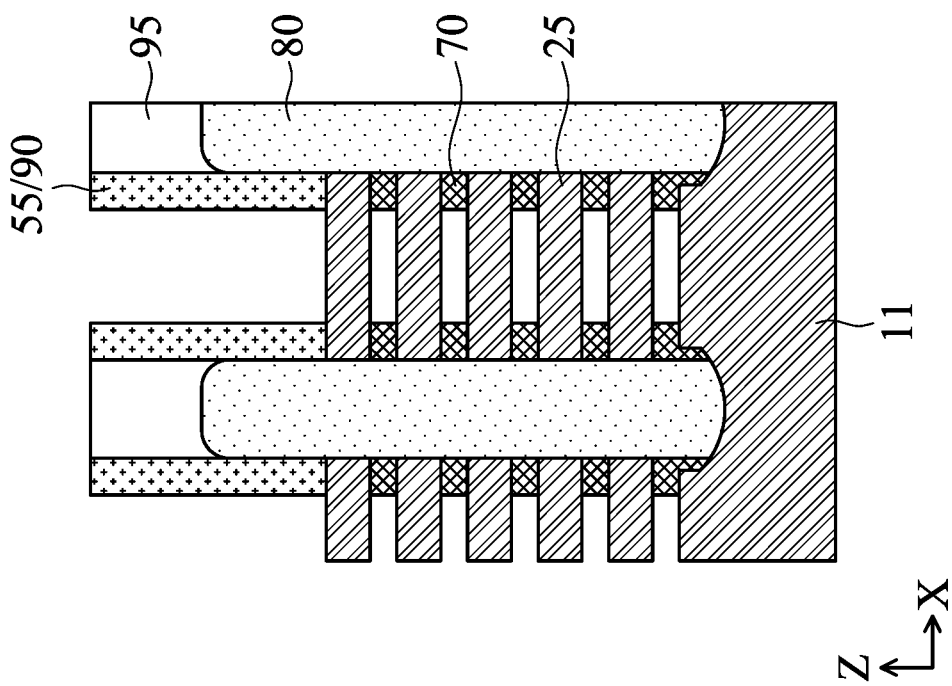
FIGS. 15A and 15B show one of the various stages of a sequential manufacturing process of a GAA FET device according to embodiments of the present disclosure.
Figure 15A:
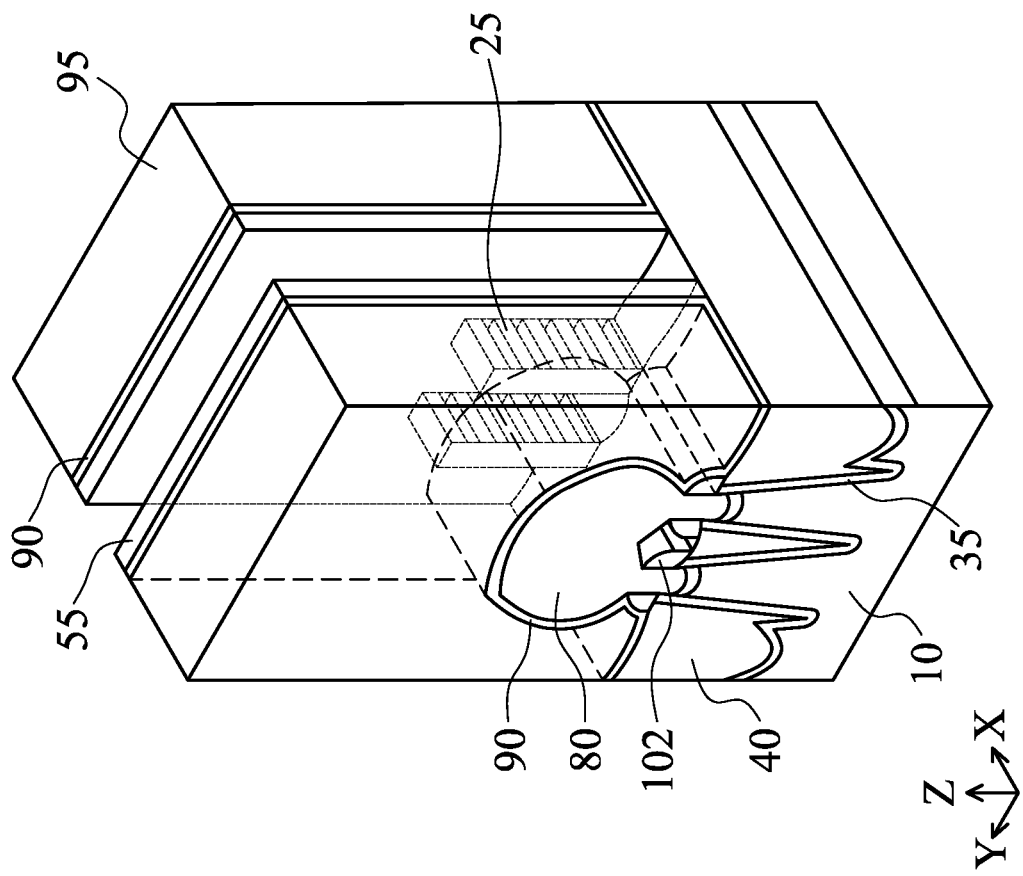

After the sacrificial gate structures are removed, the first semiconductor layers 20 in the fin structures are removed, thereby forming wires of the second semiconductor layers 25, as shown in FIGS. 15A and 15B. The first semiconductor layers 20 can be removed or etched using an etchant that can selectively etch the first semiconductor layers 20 against the second semiconductor layers 25. When the first semiconductor layers 20 are Ge or SiGe and the second semiconductor layers 25 are Si, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), a hydrochloric acid (HCl) solution, or potassium hydroxide (KOH) solution. The wet etchant further contains one or more of HF, $C_3H_8O_2$ and $C_2H_4O_3$ in some embodiments.

Figure 16:
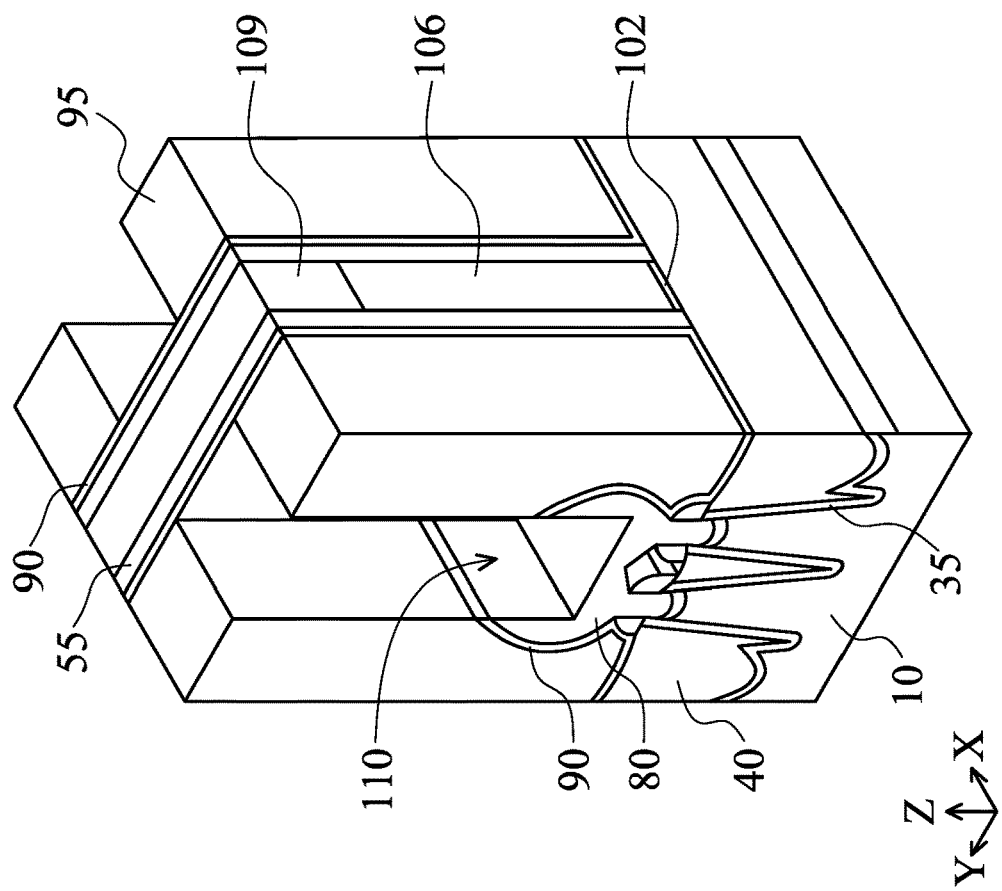
FIG. 16 shows one of the various stages of a sequential manufacturing process of a GAA FET device according to embodiments of the present disclosure.

After the wires or sheets of the second semiconductor layers 25 are formed, a gate dielectric layer 102 is formed around each channel layers (wires of the second semiconductor layers 25), and a gate electrode layer 106 is formed on the gate dielectric layer 102, as shown in FIG. 16. In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 106 is formed on the gate dielectric layer 102 to surround each channel layers. The gate electrode 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 106 may be formed by CVD, ALD, electro-plating, or other suitable method. The gate electrode layer is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode layer 106 is recessed and a cap insulating layer 109 is formed over the recessed gate electrode 106, as shown in FIG. 16. The cap insulating layer includes one or more layers of a silicon nitride-based material, such as SiN. The cap insulating layer 109 can be formed by depositing an insulating material followed by a planarization operation.

In certain embodiments of the present disclosure, one or more work function adjustment layers are interposed between the gate dielectric layer 102 and the gate electrode 106. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 17:
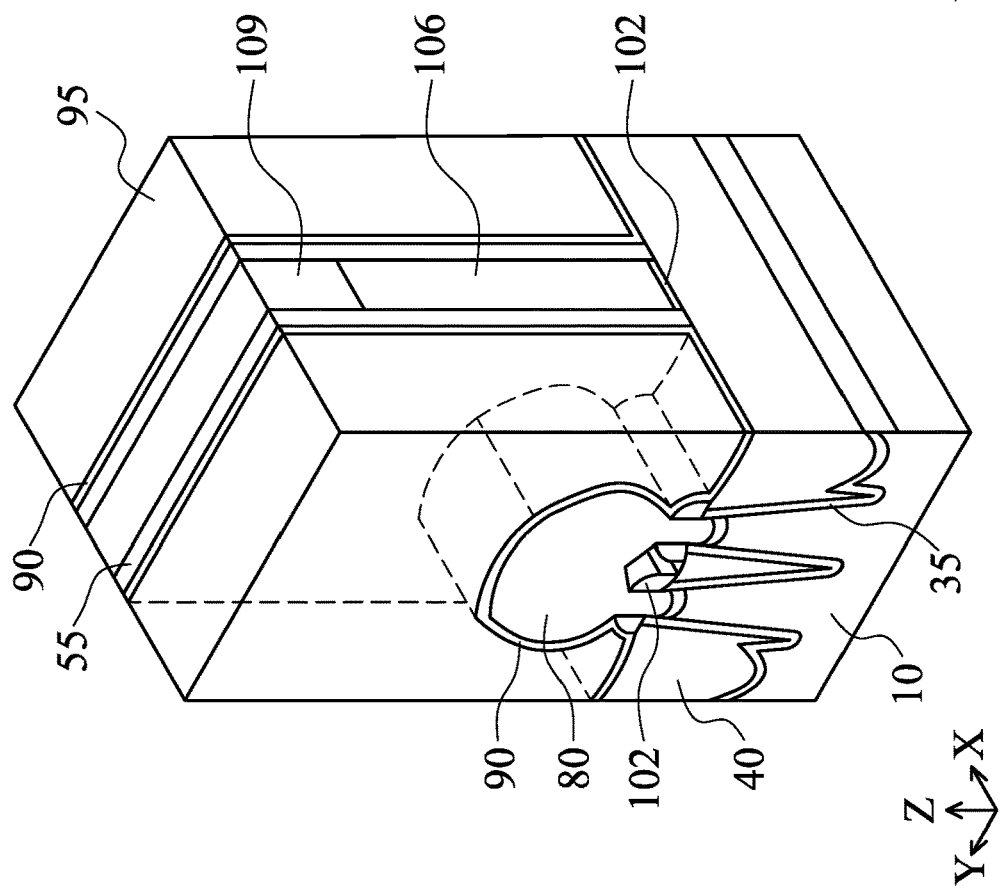
FIG. 17 shows one of the various stages of a sequential manufacturing process of a GAA FET device according to embodiments of the present disclosure.
Figure 18:
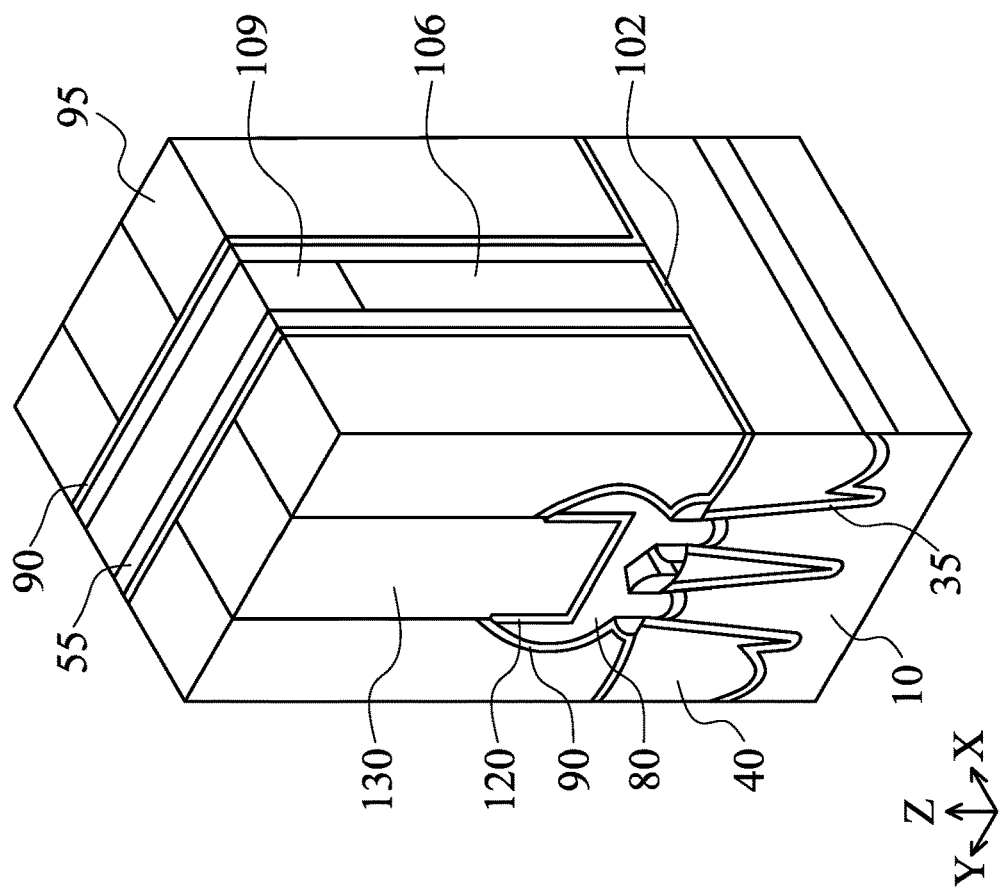
FIG. 18 shows one of the various stages of a sequential manufacturing process of a GAA FET device according to embodiments of the present disclosure.
Figure 19:
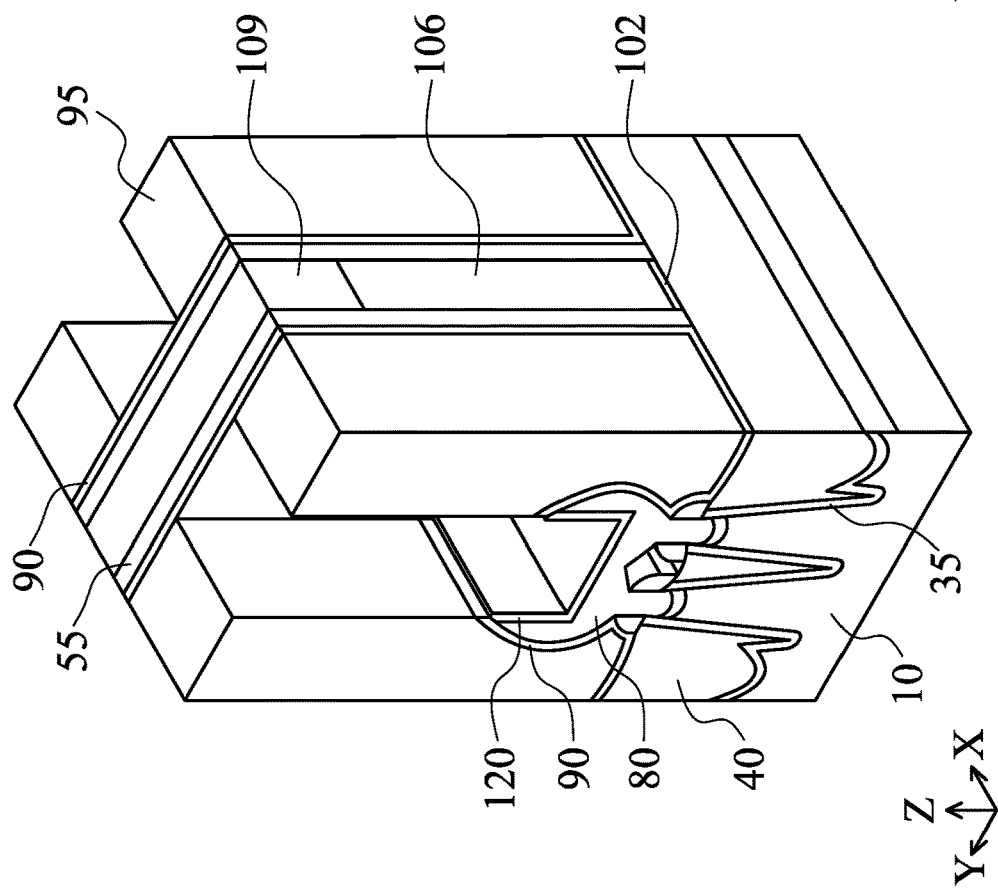
FIG. 19 shows one of the various stages of a sequential manufacturing process of a GAA FET device according to embodiments of the present disclosure.

Subsequently, contact holes 110 are formed in the ILD layer 95 by using dry etching, as shown in FIG. 17. In some embodiments, the upper portion of the S/D epitaxial layer 80 is etched. A silicide layer 120 is formed over the S/D epitaxial layer 80, as shown in FIG. 18. The silicide layer includes one or more of WSi, CoSi, NiSi, TiSi, MoSi and TaSi. Then, a conductive material 130 is formed in the contact holes as shown in FIG. 19. The conductive material 130 includes one or more of Co, Ni. W, Ti, Ta, Cu, Al, TiN and TaN.

It is understood that the GAA FETs undergoes further CMOS processes to form various features such as contacts/vias, interconnect metal layers, dielectric layers, passivation layers, etc.

FIGS. 20A, 20B, 20C, 20D, 20E, 20F, 20G and 20H show various stages of a sequential manufacturing process of a GAA FET device according to embodiments of the present disclosure. FIGS. 20A-20H show a sequential operation to form a metal gate structure for an nFET and a pFET. It is understood that in the sequential manufacturing process, one or more additional operations can be provided before, during, and after the stages shown in FIGS. 20A-20H, and some of the operations described below can be replaced or eliminated for additional embodiments of the method. The order of the operations/processes may be interchangeable. Materials, dimensions, configurations, processes, and/or operations as explained with the foregoing embodiments may be employed in the following embodiments, and detailed explanation thereof may be omitted.

Figure 20A:
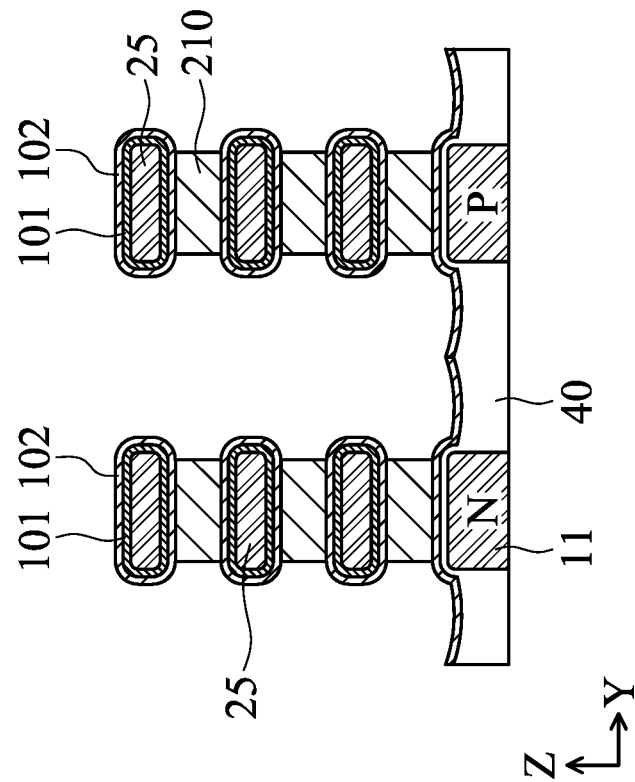
FIGS. 20A, 20B, 20C, 20D, 20E, 20F, 20G and 20H show various stages of a sequential manufacturing process of a GAA FET device according to embodiments of the present disclosure.

After the nanostructures (e.g. nanowires,nanosheets) of second first semiconductor layers 25 are released in the channel regions, an interfacial layer 101 is formed on the first semiconductor layers 25 in the gate space. The interfacial layer 101 is formed by chemical oxidation in some embodiments. Then, a high-k gate dielectric layer 102 is formed on the interfacial layer 101 by ALD or CVD. Subsequently, as shown in FIG. 20A, a sacrificial layer 210 is formed on the gate dielectric layer 102 to fill the space between adjacent nanowires or nanosheets 25. The spaces between adjacent nanowires or nanosheets 25 are fully filled by the sacrificial layer 210. In some embodiments, the sacrificial layer 210 includes one or more of TiN, Ti, TaN and Ta. In certain embodiments, TiN is used as the sacrificial layer 210. The sacrificial layer 210 is formed from CVD, ALD, PVD or other suitable method. In some embodiments, the thickness of the sacrificial layer 210 is in a range from about 0.1 nm to about 40 nm and is in a range from about 5 nm to about 30 nm in other embodiments, depending on the space between adjacent nanosheets 25.

In some embodiments, the width W11 of the nanowires or nanosheets 25 is in a range from about 10 nm to about 100 nm and is in a range from about 15 nm to about 50 nm in other embodiments. In some embodiments, the thickness D11 of the nanowires or nanosheets 25 is in a range from about 5 nm to about 50 nm and is in a range from about 10 nm to about 30 nm in other embodiments. In some embodiments, the space S11 between adjacent nanowires or nanosheets 25 is in a range from about 5 nm to about 50 nm and is in a range from about 10 nm to about 30 nm in other embodiments. In some embodiments, W11/D11 is in a range from about 1 to about 10 and is in a range from about 1.5 to 5. In some embodiments W11>D11. In some embodiments, W11/D11 is equal to 2.0 or more.

Figure 20B:
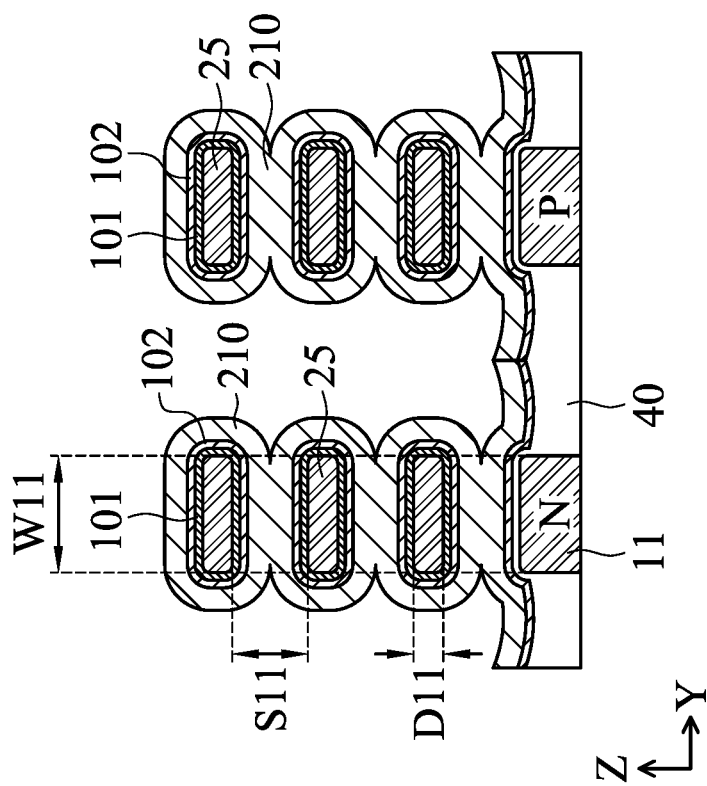

After the sacrificial layer 210 is formed, anisotropic etching is performed on both the p-type and the n-type regions to remove part of the sacrificial layer 210 other than the part formed between the adjacent nanowires or nanosheets 25, as shown in FIG. 20B. In some embodiments, plasma dry etching is used to remove the part of the sacrificial layer 21. In some embodiments, the dry etching includes a fine tuned deposition time of about 3 sec to 100 sec at the n-type and p-type boundary.

Figure 20D:
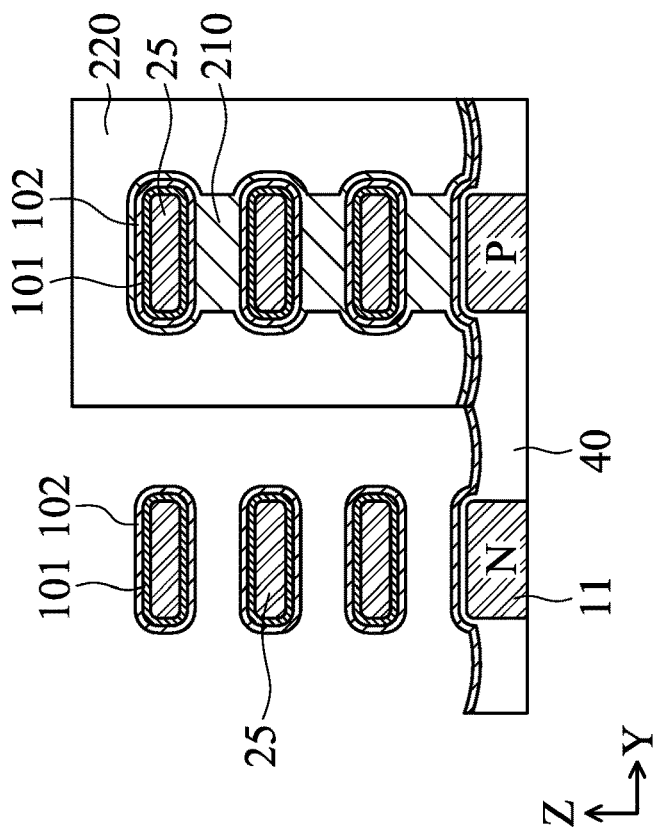
Figure 20C:
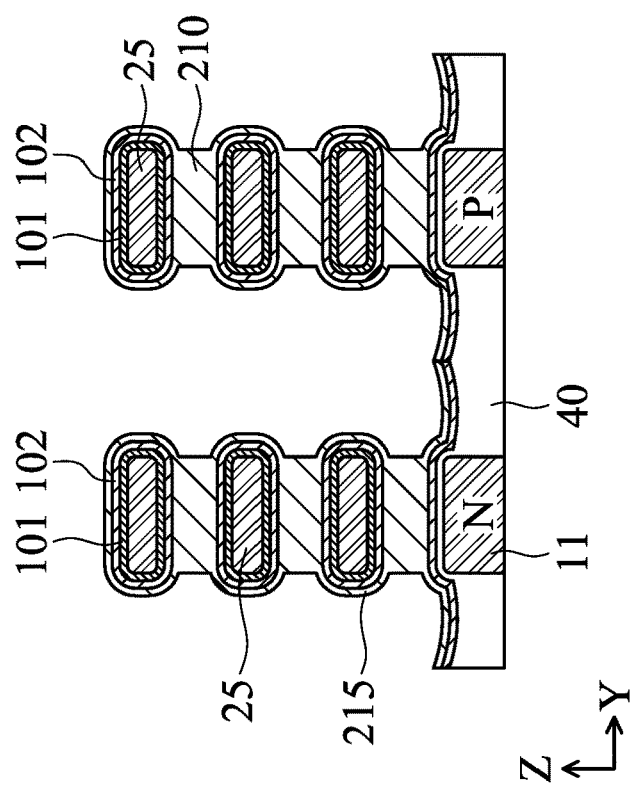

Next, a buffer layer 215 is formed as shown in FIG. 20C. In some embodiments, the buffer layer 215 includes one or more of TiN, Ti, TaN and Ta. In some embodiments, the buffer layer 215 is made of the same material as the sacrificial layer 210. In certain embodiments, TiN is used as the buffer layer 215. The buffer layer 215 is formed from CVD, ALD, PVD or other suitable method, and has a thickness in a range from about 0.1 nm to about 1.0 nm in some embodiments.

Then, as shown in FIG. 20D, the p-type region is covered by a first mask layer 220, and then the buffer layer 215 and the sacrificial layer 210 are fully removed from the n-type region. In some embodiments, one or more plasma dry etching, chemical dry etching and wet etching operations are performed to remove the buffer layer 215 and the sacrificial layer 210. When a plasma dry etching is used, an over etching time is in a range from about 3 sec to 100 sec in some embodiments. In some embodiments, the first mask layer 220 includes an organic material, such as, a photo resist, a bottom antireflective layer or an inorganic material, such as silicon nitride. In certain embodiments, the first mask layer 220 includes at least a bottom antireflective layer. After the etching, the first mask layer 220 is removed. Since the gate dielectric layer 102 is covered by the buffer layer 215, the gate dielectric layer 102 in the p-type region is protected from damage that is otherwise caused by a mask removal process including a plasma process (e.g., ashing).

Figure 20E:
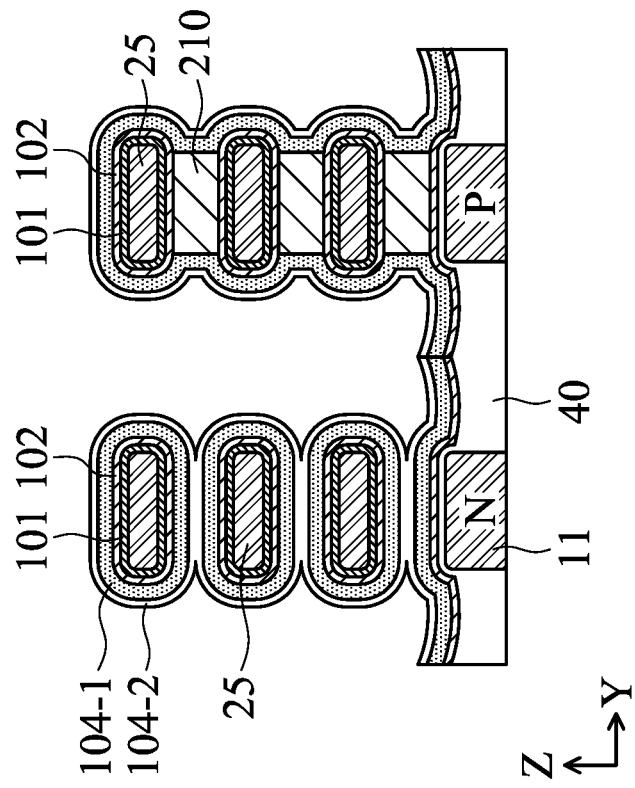

Then, anisotropic etching is performed on both the p-type and the n-type regions to remove part of the buffer layer 215 and the sacrificial layer 210 other than the part formed between the adjacent nanowires or nanosheets 25, as shown in FIG. 20E.

Figure 20F:
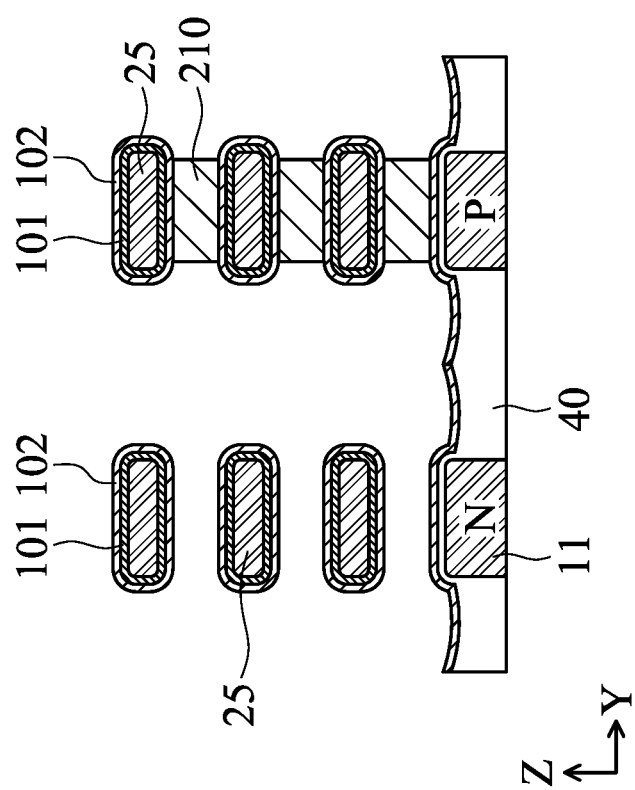

Subsequently, one or more n-type work function adjustment material layers (NWFMs) are formed on the gate dielectric layer in the n-type region and the p-type region. In some embodiments, the NWFM layer includes a first NWFM layer 104-1 and a second NWFM layer 104-2 formed on the first NWFM layer 104-1. In some embodiments, the first NWFM layer 104-1 includes TiAlC or TiAl. In some embodiments, the first NWFM layer 104-1 includes TiAlC of which Al concentration is in a range from about 20 atomic % to about 25 atomic %, Ti concentration is in a range from about 30 atomic % to about 35 atomic %, and C concentration is in a range from about 40 atomic % to about 50 atomic %. In some embodiments, the Ti concentration is smaller than the Al concentration. In some embodiments, the second NWFM layer 104-2 includes TiN or TiSiN. In some embodiments, the thickness of the first NWFM layer 104-1 is adjusted such that there is a space between adjacent nanowires or nanosheets 25 for the second NWFM layers, and the second NWFM layer 104-2 fully fills the space, as shown in FIG. 20F. In some embodiments, the thickness of the second NWFM layer 104-2 formed in the space is smaller than the thickness of the second NWFM layer 104-2 formed at a side of the nanosheets 25. In some embodiments, the thickness of the second NWFM layer 104-2 is in a range from about 10 nm to about 50 nm.

In other embodiments, the thickness of the second NWFM layer 104-2 formed in the space is equal to or greater than the thickness of the second NWFM layer 104-2 formed at a side of the nanosheets 25. As shown in FIG. 20F, since the spaces between adjacent nanosheets 25 in the p-type region are filled by the sacrificial layer 210, deposition of the NWFM layer between the adjacent nanosheets 25 in the p-type region is prevented.

Figure 20H:
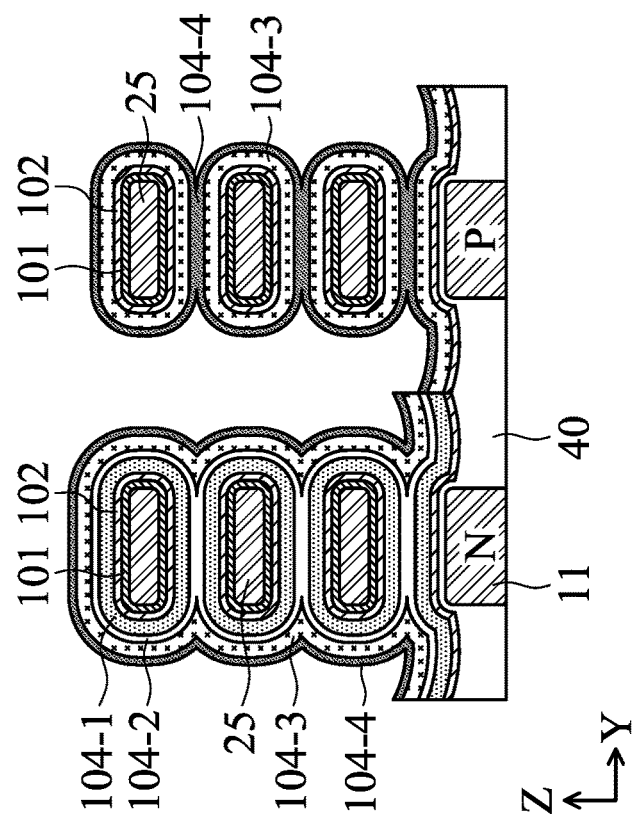
Figure 20G:
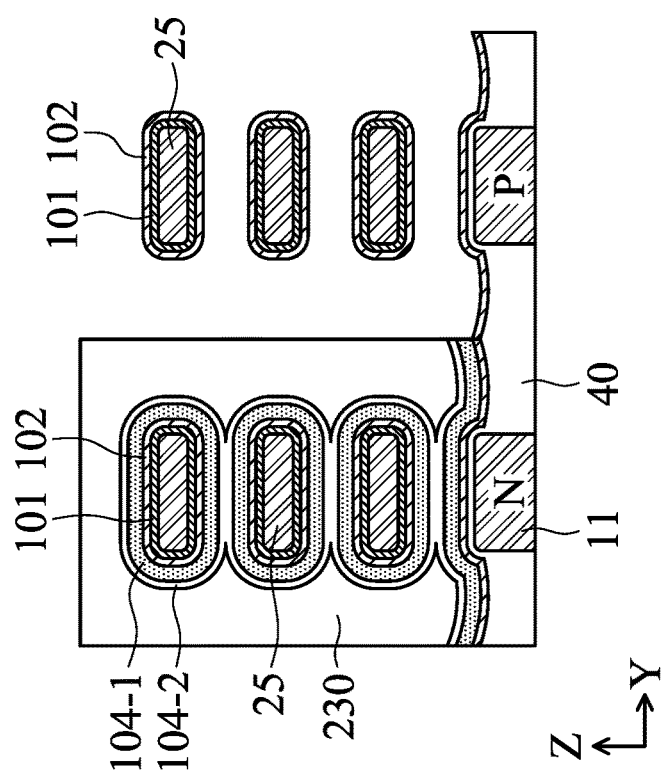

Then, as shown in FIG. 20G, the n-type region is covered by a second mask layer 230, and then all the layers formed on the gate dielectric layer 102 are fully removed from the p-type region. In some embodiments, one or more plasma dry etching, chemical dry etching and wet etching operations are performed to remove the NWFM layers 104-1, 104-2, the buffer layer 215 and the sacrificial layer 210. When a plasma dry etching is used, an over etching time is in a range from about 3 sec to 100 sec in some embodiments. In some embodiments, the second mask layer 230 includes an organic material, such as, a photo resist, a bottom antireflective layer or an inorganic material, such as silicon nitride. After the etching, the second mask layer 230 is removed. Since the gate dielectric layer 102 is covered by the NWFM layers, the gate dielectric layer 102 in the n-type region is protected from damage that is otherwise caused by a mask removal process including a plasma process (e.g., ashing).

Subsequently, one or more p-type work function adjustment material layers (PWFMs) are formed on the gate dielectric layer in the n-type region and the p-type region. In some embodiments, the PWFM layer includes a first PWFM layer 104-3 and a second PWFM layer 104-4 formed on the first PWFM layer 104-3. In some embodiments, the first PWFM layer 104-3 includes TiN or TiSiN. In some embodiments, the second PWFM layer 104-4 includes TaN. In some embodiments, the thickness of the first PWFM layer 104-3 is adjusted such that there is a space between adjacent nanowires or nanosheets 25 for the second PWFM layers, and the second PWFM layer 104-4 fully fills the space, as shown in FIG. 20H. In some embodiments, the thickness of the second PWFM layer 104-4 formed in the space is smaller than the thickness of the second PWFM layer 104-4 formed at a side of the nanosheets 25. In other embodiments, the thickness of the second PWFM layer 104-4 formed in the space is equal to or greater than the thickness of the second PWFM layer 104-4 formed at a side of the nanosheets 25. As shown in FIG. 20H, since the spaces between adjacent nanosheets 25 in the n-type region are filled by the NWFM layer, deposition of the PWFM layer between the adjacent nanosheets 25 in the n-type region is prevented.

In some embodiments, metallic layers of the gate structure for an n-type FET are formed prior to forming metallic layers of the gate structure for a p-type FET to prevent one or more of the metallic layers for the n-type FET from touching to each other. In some embodiments, the metallic layers for the n-type FET and the p-type FET are formed by using CVD, PVD and/or ALD. In certain embodiments, ALD is used. In some embodiments, the metallic layers for the n-type FET are first formed on the gate dielectric layer by ALD, and then the metallic layers for the p-type FET are formed, which can prevents Al inter diffusion.

Figure 20I:
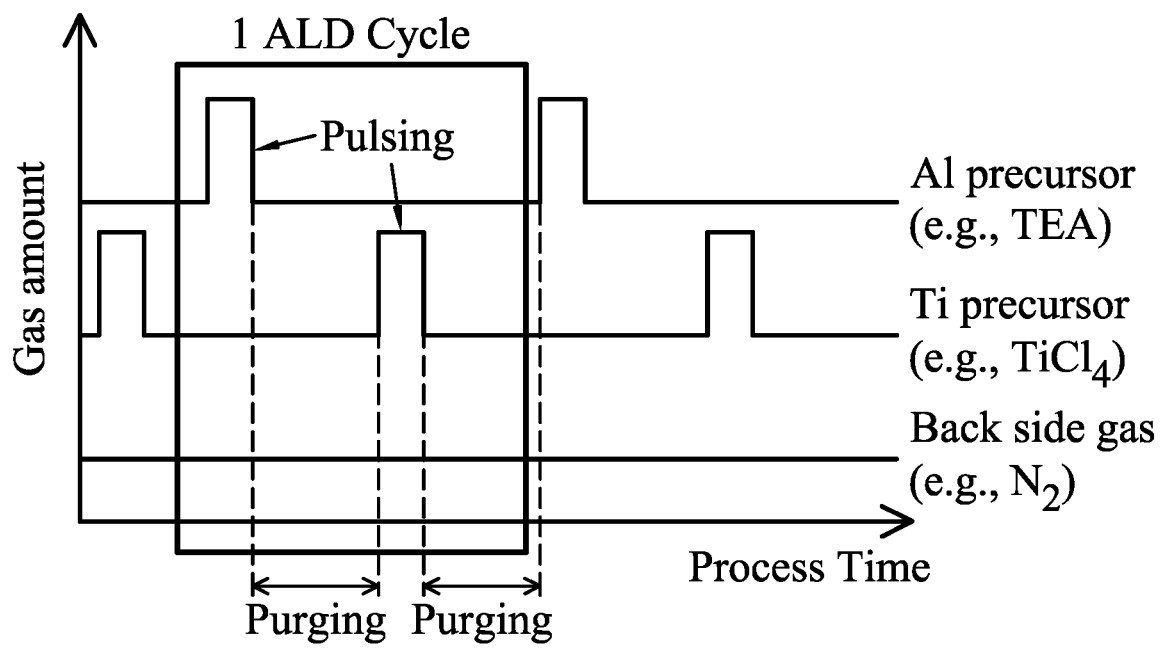
FIG. 20I shows an ALD process sequence.

FIG. 20I shows an ALD sequence for forming a TiAl or TiAlC layer according to some embodiments of the present disclosure. In some embodiments, an Al precursor (source gas) is triethylaluminium (TEA) and a Ti precursor is as $TiCl_4$, which may be diluted with Ar. As shown in FIG. 20I, precursors are provided with pulsing sequence. Each gas pulse has a time duration in a range from about 3 seconds to about 20 seconds in some embodiments. The pulse sequence is repeated 2 to 5 times in some embodiments. The order of the precursors may be interchanged. In some embodiments, the metallic layers for the gate electrodes are formed by ALD at a process temperature in a range from about 200° C. to about 600° C.

Figure 20J:
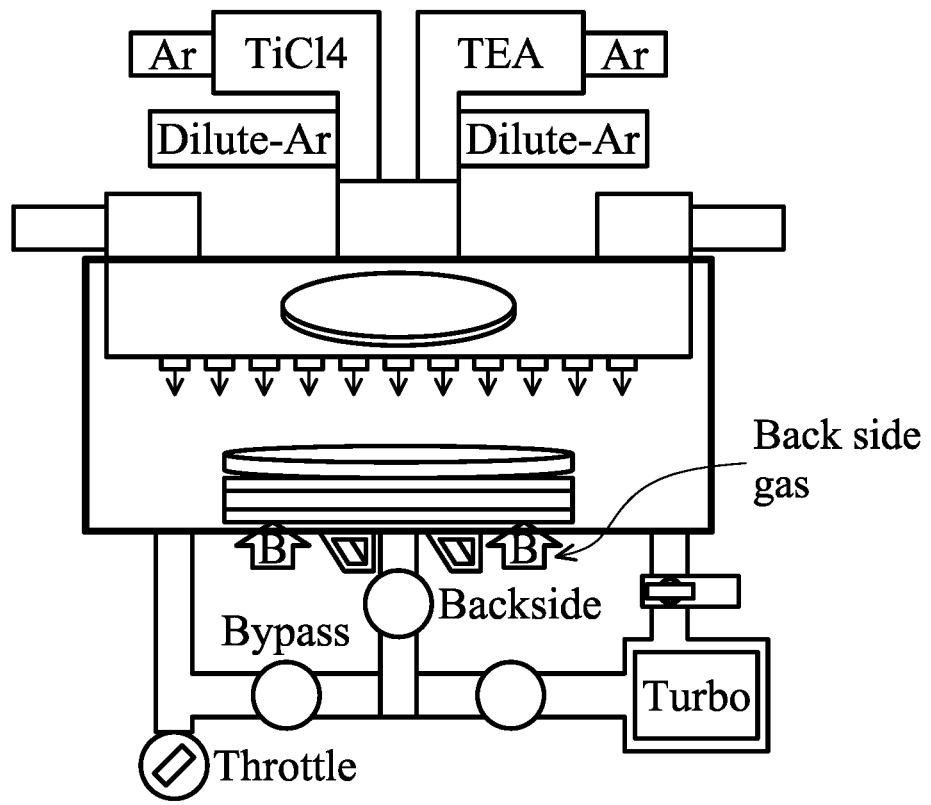
FIG. 20J shows an ALD process apparatus.

In some embodiments, as shown in FIG. 20J, a back side gas is supplied from the back side of wafer stage or the substrate during the ALD process. In some embodiments, the back side gas is nitrogen. In some embodiments, the flow amount of the back side gas is constant and is in a range from about 5 sccm to 15 sccm, which improves thickness uniformity of the TiAl or TiAlC layer.

In some embodiments, in the ALD process of TiN and/or TaN layers, composition and/or thickness of TiN and/or TaN layers can be controlled by adjusting flows of one or more source gases, such as $TiCl_4$, $NH_3$, pentakis(dimethylamino) tantalum(V) (PDMAT). In some embodiments, the flow rate of $TiCl_4$ and/or PDMAT gas flow is in a range from about 50 sccm to about 100 sccm for the metallic layers for the p-type FET. In some embodiments, when the metallic layers for the gate electrodes are formed by ALD at a process temperature in a range from about 200° C. to about 600° C. In some embodiments, a $NH_3$ gas flow for the metallic layers for the p-type FET is in a range from about 50 sccm to about 50000 sccm. The metallic layers for the p-type FET are deposited under a pressure in a range from about 0.0001 Torr to about 1 Torr. In some embodiments, the main process pressure in forming the metallic layers is in a range from about 4 Torr to about 20 Torr.

FIGS. 21A, 21B, 21C, 21D and 21E show various stages of a sequential manufacturing process of a GAA FET device according to embodiments of the present disclosure. FIGS. 21A-21E show a treatment on the gate dielectric layer 102 before forming the WFM layers.

FIG. 21A shows a structure after the gate dielectric layer 102 is formed. As shown in FIG. 21B, a metallic layer 250 is formed. In some embodiments, the first layer 250 is made of TiN or TiSiN. After the metallic layer 250 is formed, an annealing operation is performed. Then, as shown in FIG. 21C, a silicon layer 255 is formed on the metallic layer 250 by, for example, ALD. In some embodiments, the Si content in the TiSiN film is controlled by controlling a silicon source gas (e.g. $SiH_4$, $SiH_2Cl_2$ and/or $Si_2H_6$) flow. In some embodiments, the silicon layer 255 is amorphous or polysilicon. The silicon layer 255 fully fills the space between adjacent nanowires or nanosheets 25. After the silicon layer 255 is formed, an annealing operation is performed. Then, the silicon layer 255 is removed as shown in FIG. 21D and the metallic layer 250 is removed as shown in FIG. 21E. In some embodiments, a fluorine soaking process to introduce fluorine into the gate dielectric layer is performed after the Si layer 255 is formed and before the Si layer 255 is removed.

In some embodiments, the metallic layer 250 (e.g., TiN) and the Si layer 255 prevents Al penetration through a seam formed in the gate structure. In some embodiments, the Si layer prevents Al and/or Ti from consuming oxygen of the interfacial layer, and improve breakdown voltage (Vbd) of the devices. In some embodiments, the thickness of the Si layer 255 is in a range from about 0.1 nm to about 10 nm.

Figure 22A:
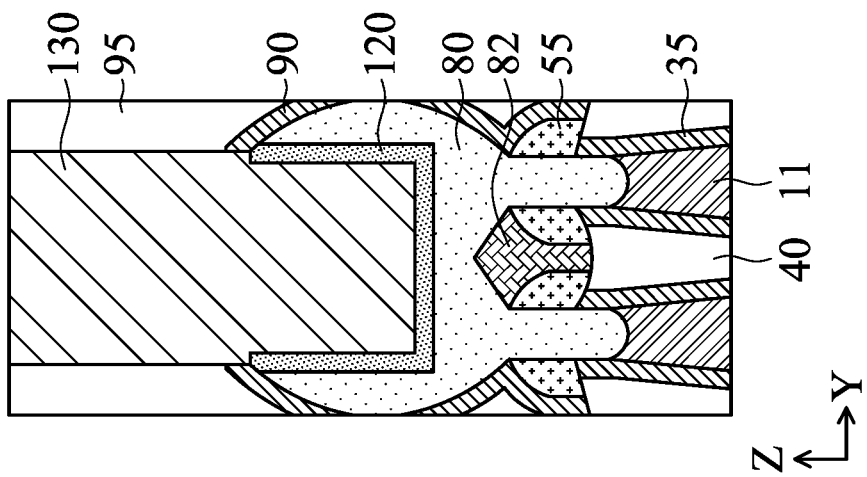
FIGS. 22A, 22B and 22C show cross sectional views of the GAA FET of FIG. 19.
Figure 22B:
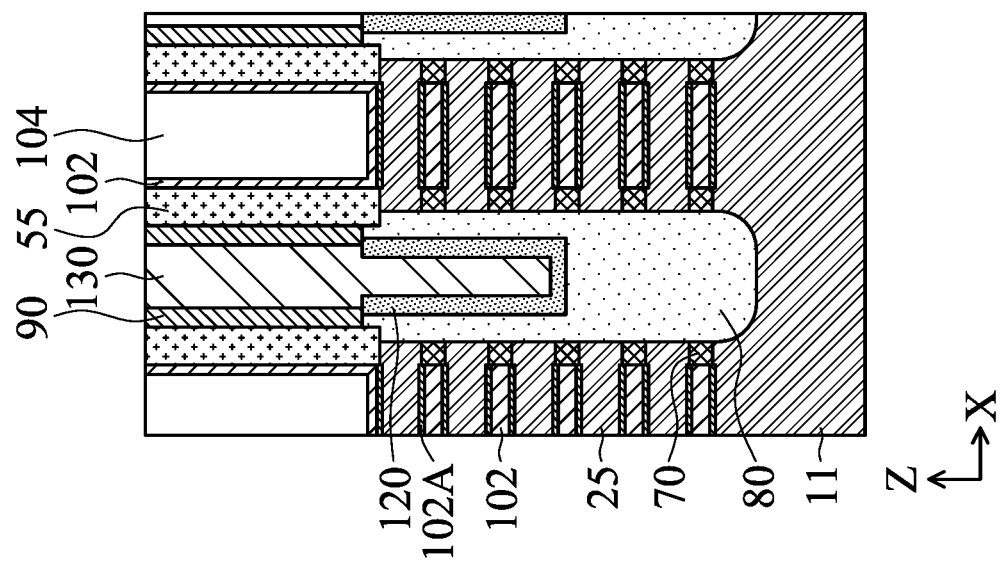
Figure 22C:
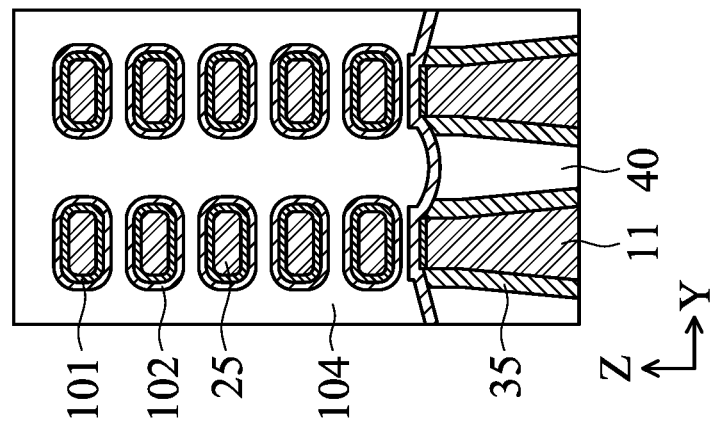

FIGS. 22A-22C show cross sectional views of the GAA FET of FIG. 19. FIG. 22A shows the cross sectional view cutting the gates along the Y direction, FIG. 22B shows the cross sectional view cutting the gates along the X direction and FIG. 22C shows the cross sectional view cutting the S/D region along the Y direction.

As shown in FIG. 22A, the wires made of the second semiconductor layer 25 are stacked in the Z direction. It is noted that the second semiconductor layers 25 may also be etched when the first semiconductor layer 20 are removed, and thus the corners of the second semiconductor layers 25 are rounded. The interfacial layer 101 wraps around each of the wires, and the gate dielectric layer 102 covers the interfacial layer 101. Although the gate dielectric layer 102 wrapping around one wire is in contact with that of the adjacent wire in FIG. 22A, the structure is not limited to FIG. 22A. In other embodiments, the gate electrode 104 also wraps around each of the wires covered by the interfacial layer 101 and the gate dielectric layer 102. As shown in FIG. 22B, the inner spacers 70 are formed between the S/D epitaxial layer 80 and the wires (second semiconductor layers 25).

In the present embodiments, when an NWFM layer or a PWFM layer is formed, spaces between adjacent nanosheets in the p-type region or the n-type region are fully filled by a sacrificial layer or other layers, and thus unnecessary WFM layer is not formed between adjacent nanosheets. In addition, each of the NWFM layer and the PWFM layer fully wraps around each of the nanosheets. Moreover, since the NWFM layer is formed prior to the PWFM layer, it is possible to obtain a desired work function for an n-type FET (e.g., about 4.44 eV to about 4.56 eV).

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, semiconductor layers, which are vertically arranged with a space between adjacent semiconductor layers, are provided over a substrate, an interfacial layer is formed around each of the semiconductor layers, a dielectric layer is formed on the interfacial layer around each of the semiconductor layers, a first conductive layer is formed on the dielectric layer, the first conductive layer is removed so that the dielectric layer is exposed, a second conductive layer is formed on the exposed dielectric layer so that the space between adjacent semiconductor layers is not fully filled by the second conductive layer, a third conductive layer is formed on the second conductive layer so that the space between adjacent semiconductor layers is filled by the third conductive layer, and the semiconductor layers are semiconductor wires or sheets. In one or more of the foregoing and following embodiments, between forming the first conductive layer and removing the first conductive layer, the first conductive layer is trimmed so that the first conductive layer remains at the space between adjacent semiconductor layers and a part of the dielectric layer is exposed, after trimming, an additional conductive layer is formed, and the additional conductive layer is removed. In one or more of the foregoing and following embodiments, the additional conductive layer is made of a same material as the first conductive layer. In one or more of the foregoing and following embodiments, the first conductive layer and the additional conductive layer are made of TiN. In one or more of the foregoing and following embodiments, the additional conductive layer is made by atomic layer deposition. In one or more of the foregoing and following embodiments, the second conductive layer is made of TiAl or TiAlC. In one or more of the foregoing and following embodiments, an aluminum concentration in the second conductive layer is in a range from 20 atomic % to 25 atomic %. In one or more of the foregoing and following embodiments, a Ti concentration in the second conductive layer is in a range from 30 atomic % to 35 atomic %. In one or more of the foregoing and following embodiments, the Ti concentration is smaller than the Al concentration. In one or more of the foregoing and following embodiments, the second conductive layer is TiAlC, and a C concentration of the second conductive layer is in a range from 40 atomic % to 50 atomic %. In one or more of the foregoing and following embodiments, the third conductive layer is made of TiN or TiSiN. In one or more of the foregoing and following embodiments, further, a fourth conductive layer is formed on the third conductive layer, and a fifth conductive layer is formed on the fourth conductive layer. The fourth conductive layer is not disposed in the space between adjacent semiconductor layers. In one or more of the foregoing and following embodiments, the semiconductor device is an n-type FET, and the fourth conductive layer is made of TiN and the fifth conductive layer is made of TaN. In one or more of the foregoing and following embodiments, the semiconductor device is a p-type FET, and the second conductive layer is made of TiN and the third conductive layer is made of TaN. In one or more of the foregoing and following embodiments, a thickness D of each of the semiconductor sheets and a width W of the semiconductor sheets satisfy $1 < W/D \leq 10$.

In accordance with another aspect of the present disclosure, in a method of manufacturing a semiconductor device, semiconductor layers, which are vertically arranged with a space between adjacent semiconductor layers, are provided over a substrate, an interfacial layer is formed around each of the semiconductor layers, a dielectric layer is formed on the interfacial layer around each of the semiconductor layers, a first conductive layer is formed on the dielectric layer, the first conductive layer is trimmed so that the first conductive layer remains at the space between adjacent semiconductor layers and a part of the dielectric layer is exposed, after the trimming, an additional conductive layer is formed, at least the additional conductive layer is removed so that the first conductive layer remains at the space between adjacent semiconductor layers and a part of the dielectric layer is exposed, the first conductive layer is removed so that the dielectric layer is exposed, a second conductive layer is formed on the exposed dielectric layer, and a third conductive layer is formed on the second conductive layer, and the semiconductor layers are semiconductor wires or sheets. In one or more of the foregoing and following embodiments, the additional conductive layer is made of a same material as the first conductive layer. In one or more of the foregoing and following embodiments, the first conductive layer and the additional conductive layer are made of TiN. In one or more of the foregoing and following embodiments, the additional conductive layer is made by atomic layer deposition. In one or more of the foregoing and following embodiments, the second conductive layer is made of TiN or TiSiN. In one or more of the foregoing and following embodiments, the third conductive layer is made of TaN. In one or more of the foregoing and following embodiments, a thickness D of each of the semiconductor sheets and a width W of the semiconductor sheets satisfy $1<W/D\leq 10$.

In accordance with another aspect of the present disclosure, in a method of manufacturing a semiconductor device, first semiconductor layers, which are vertically arranged with a space between adjacent first semiconductor layers, are provided over a substrate, and second semiconductor layers, which are vertically arranged with a space between adjacent second semiconductor layers, are provided over the substrate. An interfacial layer is formed around each of the first and second semiconductor layers. A dielectric layer is formed on the interfacial layer around each of the first and second semiconductor layers. A first conductive layer is formed on the dielectric layer around each of the first and second semiconductor layers. The first conductive layer is trimmed so that the first conductive layer remains at the space between adjacent first semiconductor layers and a part of the dielectric layer on the first semiconductor layers is exposed, and the first conductive layer remains at the space between adjacent second semiconductor layers and a part of the dielectric layer on the second semiconductor layers is exposed. After the trimming, an additional conductive layer is formed at the first and second semiconductor layers. The second semiconductor layers is covered with a first cover layer. The additional conductive layer and the first conductive layer are removed from the first semiconductor layers, while covering the second semiconductor layers with the first cover layer, so that the dielectric layer on the first semiconductor layers is exposed. The first cover layer is removed. A second conductive layer is formed on the exposed dielectric layer around each of the first semiconductor layers and over the second semiconductor layers. A third conductive layer is formed on the second conductive layer. The first semiconductor layers is covered with a second cover layer. The first conductive layer is removed from the second semiconductor layers, while covering the first semiconductor layers with the first cover layer, so that the dielectric layer on the second semiconductor layers is exposed. The second cover layer is removed. A fourth conductive layer is formed on the exposed dielectric layer around each of the second semiconductor layers and over the third conductive layer on the first semiconductor layers. A fifth conductive layer is formed on the fourth conductive layer. The semiconductor layers are semiconductor wires or sheets. In one or more of the foregoing and following embodiments, the second conductive layer is formed such that the space between adjacent first semiconductor layers is not fully filled by the second conductive layer, and the third conductive layer is formed such that the space between adjacent first semiconductor layers is filled by the third conductive layer. In one or more of the foregoing and following embodiments, the fourth conductive layer is formed such that the space between adjacent second semiconductor layers is not fully filled by the fourth conductive layer, and the fifth conductive layer is formed such that the space between adjacent second semiconductor layers is filled by the fifth conductive layer.

In accordance with another aspect of the present disclosure, in a method of manufacturing a semiconductor device, a first group of semiconductor layers for an n-type FET and a second group of semiconductor layers for a p-type FET are provided, each of which are vertically arranged with a space between adjacent semiconductor layers, over a bottom fin structure disposed on a substrate. A dielectric layer is formed around each of the semiconductor layers in the first group and the second group. Spaces between the semiconductor layers in the second group are filled with a sacrificial layer. One or more n-type work function adjustment layers are formed around the semiconductor layers in the first group so that spaces between the semiconductor layers in the first group are fully filled by the one or more n-type work function adjustment layers. After the one or more n-type work function adjustment layers are formed, the sacrificial layer is removed from the second group. One or more p-type work function adjustment layers are formed around the semiconductor layers in the second group. The semiconductor layers are semiconductor wires or sheets. In one or more of the foregoing and following embodiments, the sacrificial layer is made of TiN. In one or more of the foregoing and following embodiments, in the filling the spaces between the semiconductor layers in the second group, a TiN layer is formed on the dielectric layer, the TiN layer is trimmed so that the TiN layer remains at the spaces and a part of the dielectric layer is exposed, after the trimming, an additional layer is formed, and at least the additional layer is removed so that the TiN layer remains at the spaces and a part of the dielectric layer is exposed. In one or more of the foregoing and following embodiments, the additional layer is made by atomic layer deposition.

In accordance with another aspect of the present disclosure, a semiconductor device includes a plurality of semiconductor nanosheets arranged in a vertical direction over a substrate, a gate dielectric layer wrapping around a channel region of each of the plurality of semiconductor nanosheets, a first metallic layer disposed on the gate dielectric layer and wrapping around a channel region of each of the plurality of semiconductor nanosheets, a second metallic layer disposed on the first metallic layer and wrapping around a channel region of each of the plurality of semiconductor nanosheets, and a third metallic layer disposed on the second metallic layer. The second metallic layer fully fills a space between adjacent ones of the plurality of semiconductor nanosheets.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
providing semiconductor layers, which are vertically arranged with a space between adjacent semiconductor layers, over a substrate;
forming a dielectric layer around each of the semiconductor layers;
forming a first conductive layer on the dielectric layer;
removing the first conductive layer so that the dielectric layer is exposed;
forming a second conductive layer on the exposed dielectric layer so that the space between adjacent semiconductor layers is not fully filled by the second conductive layer; and
forming a third conductive layer on the second conductive layer so that the space between adjacent semiconductor layers is filled by the third conductive layer,
wherein the semiconductor layers are semiconductor wires or sheets.

2. The method of claim 1, further comprising, between the forming the first conductive layer and the removing the first conductive layer:
trimming the first conductive layer so that the first conductive layer remains at the space between adjacent semiconductor layers and a part of the dielectric layer is exposed;
after the trimming, forming an additional conductive layer;
removing the additional conductive layer.

3. The method of claim 2, wherein the additional conductive layer is made of a same material as the first conductive layer.

4. The method of claim 3, wherein the first conductive layer and the additional conductive layer are made of TiN.

5. The method of claim 2, wherein the additional conductive layer is made by atomic layer deposition.

6. The method of claim 1, wherein the second conductive layer is made of TiAl or TiAlC.

7. The method of claim 6, wherein an aluminum concentration in the second conductive layer is in a range from 20 atomic % to 25 atomic %.

8. The method of claim 7, wherein a Ti concentration in the second conductive layer is in a range from 30 atomic % to 35 atomic %.

9. The method of claim 8, wherein the Ti concentration is smaller than the Al concentration.

10. The method of claim 7, wherein the second conductive layer is TiAlC, and a C concentration of the second conductive layer is in a range from 40 atomic % to 50 atomic %.

11. The method of claim 1, wherein the third conductive layer is made of TiN or TiSiN.

12. The method of claim 1, further comprising:
forming a fourth conductive layer on the third conductive layer; and
forming a fifth conductive layer on the fourth conductive layer,
wherein the fourth conductive layer is not disposed in the space between adjacent semiconductor layers.

13. The method of claim 12, wherein:
the semiconductor device is an n-type FET, and
the fourth conductive layer is made of TiN and the fifth conductive layer is made of TaN.

14. The method of claim 1, wherein:
the semiconductor device is a p-type FET, and the second conductive layer is made of TiN and the third conductive layer is made of TaN.

15. The method of claim 1, wherein a thickness D of each of the semiconductor sheets and a width W of the semiconductor sheets satisfy $1 < W/D \leq 10$.

16. A method of manufacturing a semiconductor device, comprising:
providing semiconductor layers, which are vertically arranged with a space between adjacent semiconductor layers, over a substrate;
forming a dielectric layer around each of the semiconductor layers;
forming a first conductive layer on the dielectric layer;
trimming the first conductive layer so that the first conductive layer remains at the space between adjacent semiconductor layers and a part of the dielectric layer is exposed;
after the trimming, forming an additional conductive layer;
removing at least the additional conductive layer so that the first conductive layer remains at the space between adjacent semiconductor layers and a part of the dielectric layer is exposed;
removing the first conductive layer so that the dielectric layer is exposed;
forming a second conductive layer on the exposed dielectric layer; and
forming a third conductive layer on the second conductive layer,
wherein the semiconductor layers are semiconductor wires or sheets.

17. The method of claim 16, wherein the additional conductive layer is made of a same material as the first conductive layer.

18. The method of claim 17, wherein the first conductive layer and the additional conductive layer are made of TiN.

19. The method of claim 16, wherein the additional conductive layer is made by atomic layer deposition.

20. A method of manufacturing a semiconductor device, comprising:
providing semiconductor layers, which are vertically arranged with a space between adjacent semiconductor layers, over a substrate;
forming a dielectric layer around each of the semiconductor layers;
forming a first conductive layer on the dielectric layer;
trimming the first conductive layer so that the first conductive layer remains at the space between adjacent semiconductor layers and a part of the dielectric layer is exposed;
after the trimming, forming an additional conductive layer;
removing at least the additional conductive layer so that the first conductive layer remains at the space between adjacent semiconductor layers and a part of the dielectric layer is exposed;
removing the first conductive layer so that the dielectric layer is exposed;
forming a second conductive layer on the exposed dielectric layer;
forming a third conductive layer on the second conductive layer;
removing the third conductive layer, the second conductive layer and the remaining first conductive layer so that the dielectric layer is exposed;
forming a fourth conductive layer on the exposed dielectric layer; and forming a fifth conductive layer on the second conductive layer, wherein the semiconductor layers are semiconductor wires or sheets.

* * * * *